(12) United States Patent
Chin et al.

(10) Patent No.: US 11,101,001 B2
(45) Date of Patent: Aug. 24, 2021

(54) NON-VOLATILE MEMORY WITH MULTI-PLANE MIXED SUB-BLOCK PROGRAMMING

(71) Applicant: SANDISK TECHNOLOGIES LLC, Addison, TX (US)

(72) Inventors: Henry Chin, Fremont, CA (US); Zhenming Zhou, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/021,290

(22) Filed: Jun. 28, 2018

(65) Prior Publication Data

US 2019/0348127 A1 Nov. 14, 2019

Related U.S. Application Data

(60) Provisional application No. 62/668,365, filed on May 8, 2018.

(51) Int. Cl.

| G11C 16/12 | (2006.01) |
|---|---|
| G11C 16/24 | (2006.01) |
| G11C 16/26 | (2006.01) |
| G11C 16/08 | (2006.01) |
| G11C 16/34 | (2006.01) |
| G11C 16/04 | (2006.01) |
| G11C 8/12 | (2006.01) |

(52) U.S. Cl.
CPC .............. *G11C 16/24* (2013.01); *G11C 8/12* (2013.01); *G11C 16/0483* (2013.01); *G11C 16/08* (2013.01); *G11C 16/12* (2013.01); *G11C 16/26* (2013.01); *G11C 16/3459* (2013.01); *G11C 2216/22* (2013.01)

(58) Field of Classification Search
CPC ..... G11C 16/0483; G11C 16/08; G11C 16/12; G11C 8/12; G11C 16/24; G11C 16/26; G11C 16/3459; G11C 2216/22; G11C 11/5628; G11C 16/10; G11C 16/30; G11C 5/147

See application file for complete search history.

(56) References Cited

U.S. PATENT DOCUMENTS

| 6,240,040 B1 | 5/2001 | Akaogi |
|---|---|---|
| 6,871,257 B2 | 3/2005 | Conley |

(Continued)

FOREIGN PATENT DOCUMENTS

| KR | 20140017296 A | 2/2014 |
|---|---|---|
| KR | 101448169 B1 | 10/2014 |

(Continued)

OTHER PUBLICATIONS

PCT International Search Report dated May 29, 2019, PCT Patent Application No. PCT/US2019/016719.

(Continued)

*Primary Examiner* — Jay W. Radke
(74) *Attorney, Agent, or Firm* — Vierra Magen Marcus LLP

(57) ABSTRACT

A non-volatile memory system includes a control circuit connected to non-volatile memory cells. The control circuit is configured to simultaneously program memory cells connected to different word lines that are in different sub-blocks of different blocks in different planes of a die.

17 Claims, 21 Drawing Sheets

(56) References Cited

U.S. PATENT DOCUMENTS

| | | | |
|---|---|---|---|
| 6,883,044 B1 | 4/2005 | Roohparvar | |
| 7,020,026 B2 | 3/2006 | Guterman | |
| 7,626,865 B2* | 12/2009 | Ha | G11C 16/30 365/185.18 |
| 9,514,827 B1* | 12/2016 | Nam | G11C 16/16 |
| 9,570,178 B2* | 2/2017 | Joo | G11C 16/26 |
| 9,842,657 B1 | 12/2017 | Dutta | |
| 9,922,992 B1 | 3/2018 | Yu | |
| 2004/0233722 A1* | 11/2004 | Martines | G11C 16/10 365/185.18 |
| 2006/0250846 A1* | 11/2006 | Park | G11C 16/0483 365/185.17 |
| 2007/0143570 A1 | 6/2007 | Gorobets | |
| 2008/0089130 A1* | 4/2008 | Park | G11C 8/08 365/185.18 |
| 2009/0168534 A1 | 7/2009 | Park | |
| 2009/0196102 A1 | 8/2009 | Kim | |
| 2009/0196103 A1 | 8/2009 | Kim | |
| 2009/0225600 A1* | 9/2009 | Park | G11C 11/5628 365/185.11 |
| 2010/0290286 A1 | 11/2010 | Koya | |
| 2011/0010484 A1 | 1/2011 | Sprouse | |
| 2011/0138100 A1 | 6/2011 | Sinclair | |
| 2011/0222348 A1* | 9/2011 | Kim | G11C 16/10 365/185.18 |
| 2011/0273944 A1* | 11/2011 | Park | G11C 7/106 365/189.15 |
| 2012/0020161 A1* | 1/2012 | Haukness | G11C 16/10 365/185.17 |
| 2013/0128675 A1* | 5/2013 | Kim | G11C 7/10 365/189.05 |
| 2013/0166825 A1* | 6/2013 | Kim | G06F 12/0246 711/103 |
| 2013/0223147 A1* | 8/2013 | Kwak | G11C 16/107 365/185.11 |
| 2013/0235673 A1 | 9/2013 | Kwak | |
| 2014/0063952 A1* | 3/2014 | Hara | G11C 16/06 365/185.11 |
| 2014/0104965 A1 | 4/2014 | Iran | |
| 2015/0380097 A1* | 12/2015 | Sato | G11C 11/56 365/185.03 |
| 2016/0071594 A1 | 3/2016 | Paudel et al. | |
| 2016/0078951 A1* | 3/2016 | Lin | G11C 16/0483 365/185.29 |
| 2016/0172043 A1* | 6/2016 | Kang | G11C 16/0483 365/185.12 |
| 2018/0276070 A1* | 9/2018 | Lin | G06F 3/0679 |
| 2018/0322932 A1* | 11/2018 | Periyannan | G11C 16/3427 |
| 2018/0374541 A1* | 12/2018 | Jung | G11C 16/08 |
| 2019/0163620 A1* | 5/2019 | Muthiah | G06F 3/0688 |
| 2019/0278705 A1* | 9/2019 | Park | G06F 12/0246 |

FOREIGN PATENT DOCUMENTS

| | | |
|---|---|---|
| KR | 20160099579 A | 8/2016 |
| KR | 101701361 B1 | 2/2017 |

OTHER PUBLICATIONS

PCT Written Opinion of the International Searching Authority dated May 29, 2019, PCT Patent Application No. PCT/US2019/016719.
European Search Report dated Sep. 29, 2020, European Patent Application No. 19799676.2.

* cited by examiner

Figure 4D
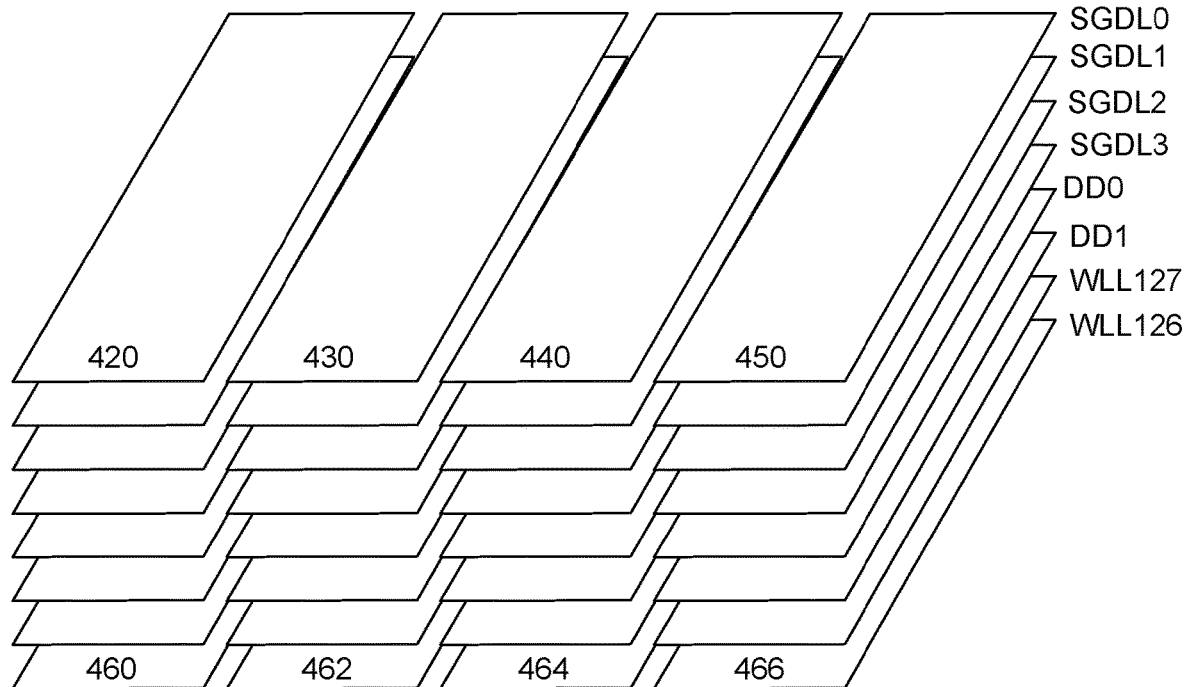
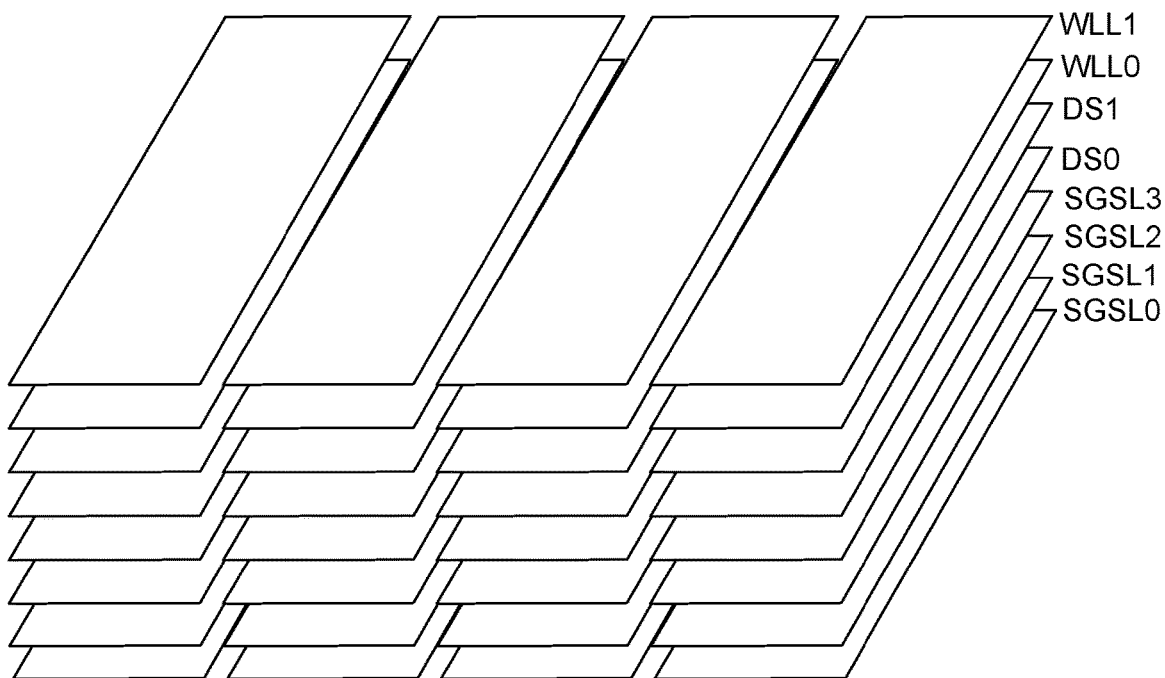

|              | S0 | S1 | S2 | S3 | S4 | S5 | S6 | S7 |
|--------------|----|----|----|----|----|----|----|----|
| Upper Page   | 1  | 1  | 1  | 0  | 0  | 0  | 0  | 1  |
| Middle Page  | 1  | 1  | 0  | 0  | 1  | 1  | 0  | 0  |
| Lower Page   | 1  | 0  | 0  | 0  | 0  | 1  | 1  | 1  |

Figure 14

| |
|---|
| simultaneously program memory cells connected to different word lines that are in different sub-blocks of different blocks in different planes of a die |

| |
|---|
| program a first set of non-volatile memory cells connected to a first word line in a lower sub-block of a block in a first plane on a die |

722

| |
|---|
| simultaneously with programming the first set of non-volatile memory cells, program a second set of non-volatile memory cells connected to a second word line in an upper sub-block of a block in a second plane on the die |

| |
|---|
| apply a same selected bit line voltage to selected bit lines in selected blocks in both planes and a same inhibit voltage to unselected bit lines in selected blocks in both planes |

752

| |
|---|
| program a first set of non-volatile memory cells connected to a first word line in a lower sub-block of a block in a first plane on a die by applying a first set of one or more voltage pulses to the first word line, the first set of one or more voltage pulses include a first magnitude for a first voltage pulse of the first set of one or more voltage pulses |

754

| |
|---|
| simultaneously with programming the first set of non-volatile memory cells, program a second set of non-volatile memory cells connected to a second word line in an upper sub-block of a block in a second plane on the die by applying a second set of one or more voltage pulses to the second word line, the second set of one or more voltage pulses include a second magnitude for a first voltage pulse of the second set of one or more voltage pulses, the second magnitude is different than the first magnitude |

Figure 17

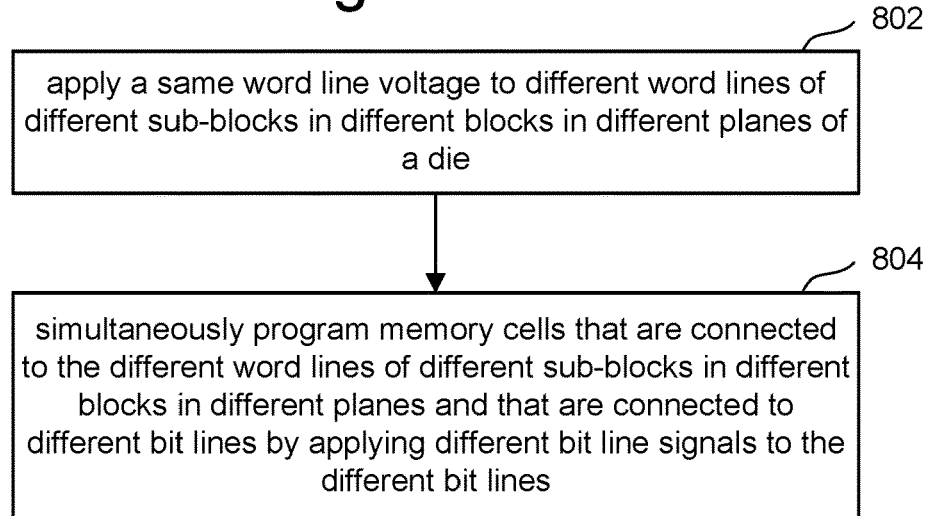

802 — apply a same word line voltage to different word lines of different sub-blocks in different blocks in different planes of a die 804 — simultaneously program memory cells that are connected to the different word lines of different sub-blocks in different blocks in different planes and that are connected to different bit lines by applying different bit line signals to the different bit lines

Figure 18

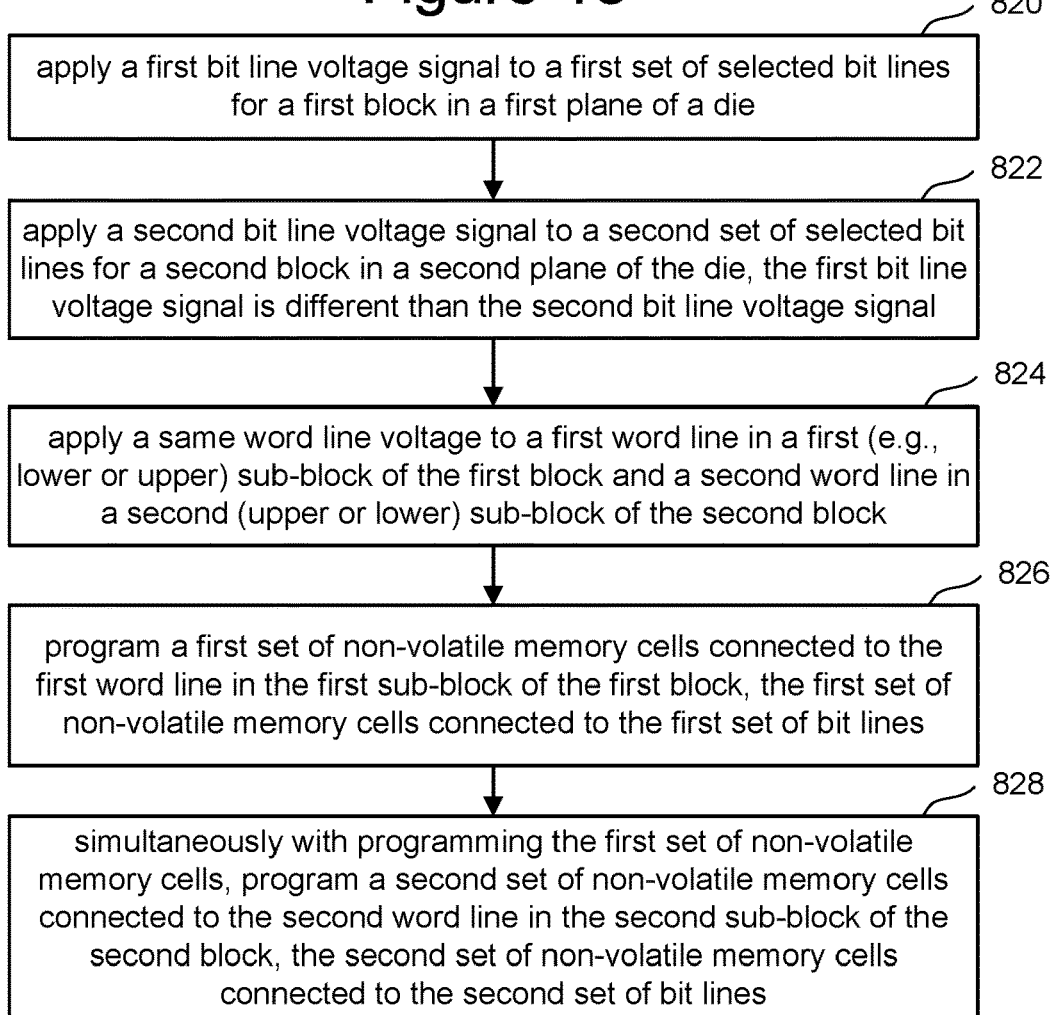

820 — apply a first bit line voltage signal to a first set of selected bit lines for a first block in a first plane of a die 822 — apply a second bit line voltage signal to a second set of selected bit lines for a second block in a second plane of the die, the first bit line voltage signal is different than the second bit line voltage signal 824 — apply a same word line voltage to a first word line in a first (e.g., lower or upper) sub-block of the first block and a second word line in a second (upper or lower) sub-block of the second block 826 — program a first set of non-volatile memory cells connected to the first word line in the first sub-block of the first block, the first set of non-volatile memory cells connected to the first set of bit lines 828 — simultaneously with programming the first set of non-volatile memory cells, program a second set of non-volatile memory cells connected to the second word line in the second sub-block of the second block, the second set of non-volatile memory cells connected to the second set of bit lines

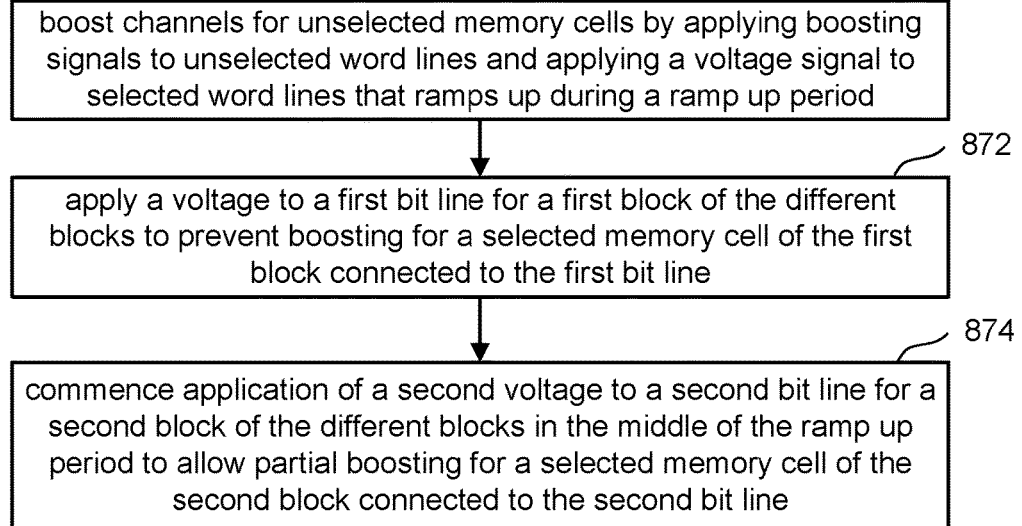
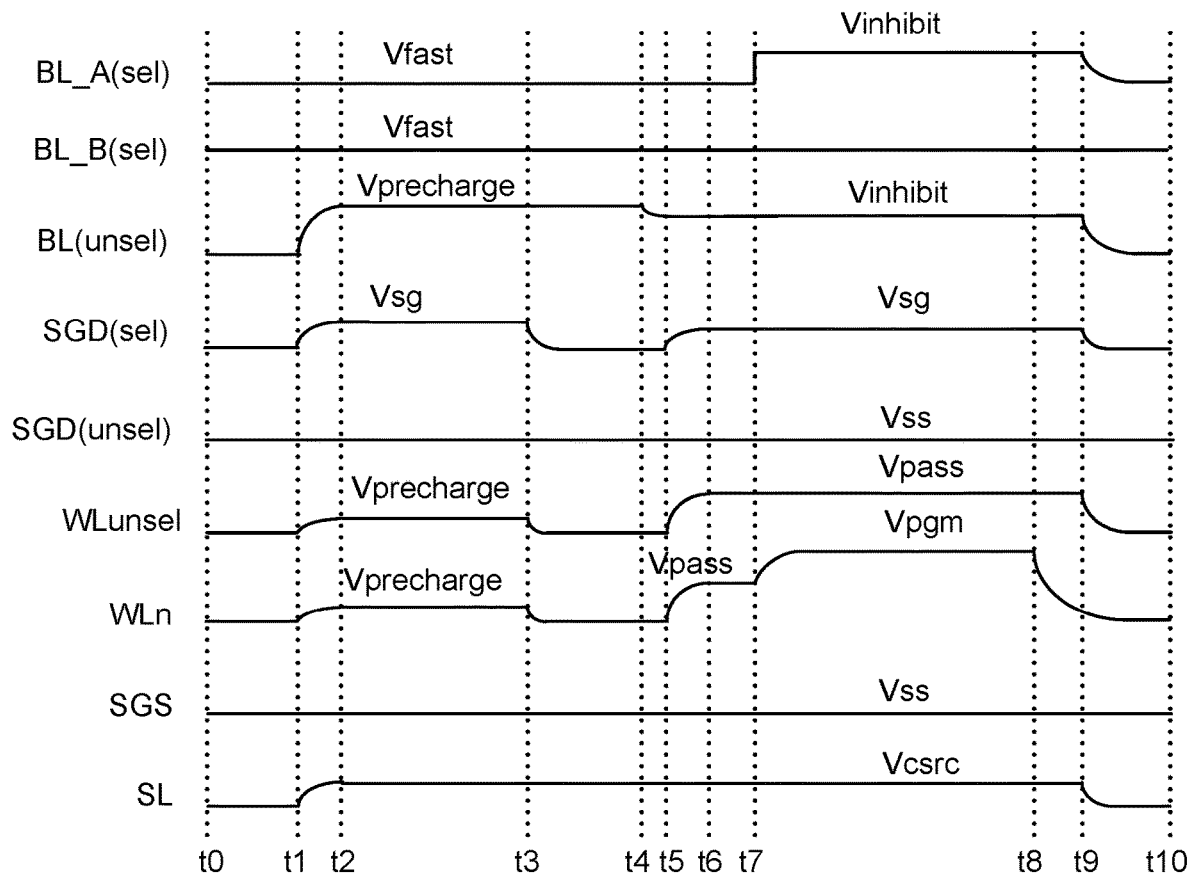

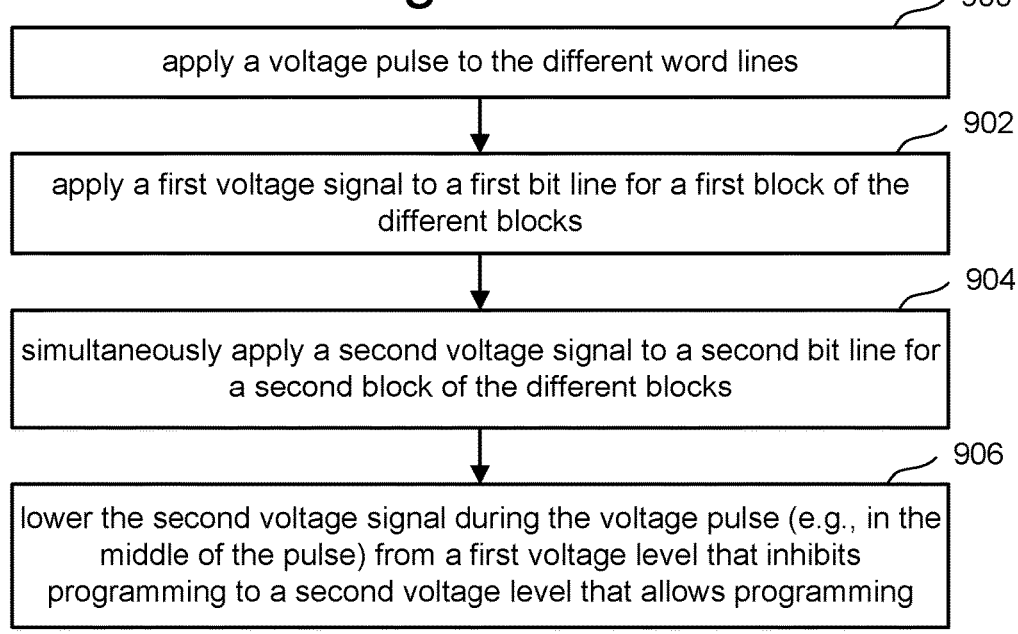
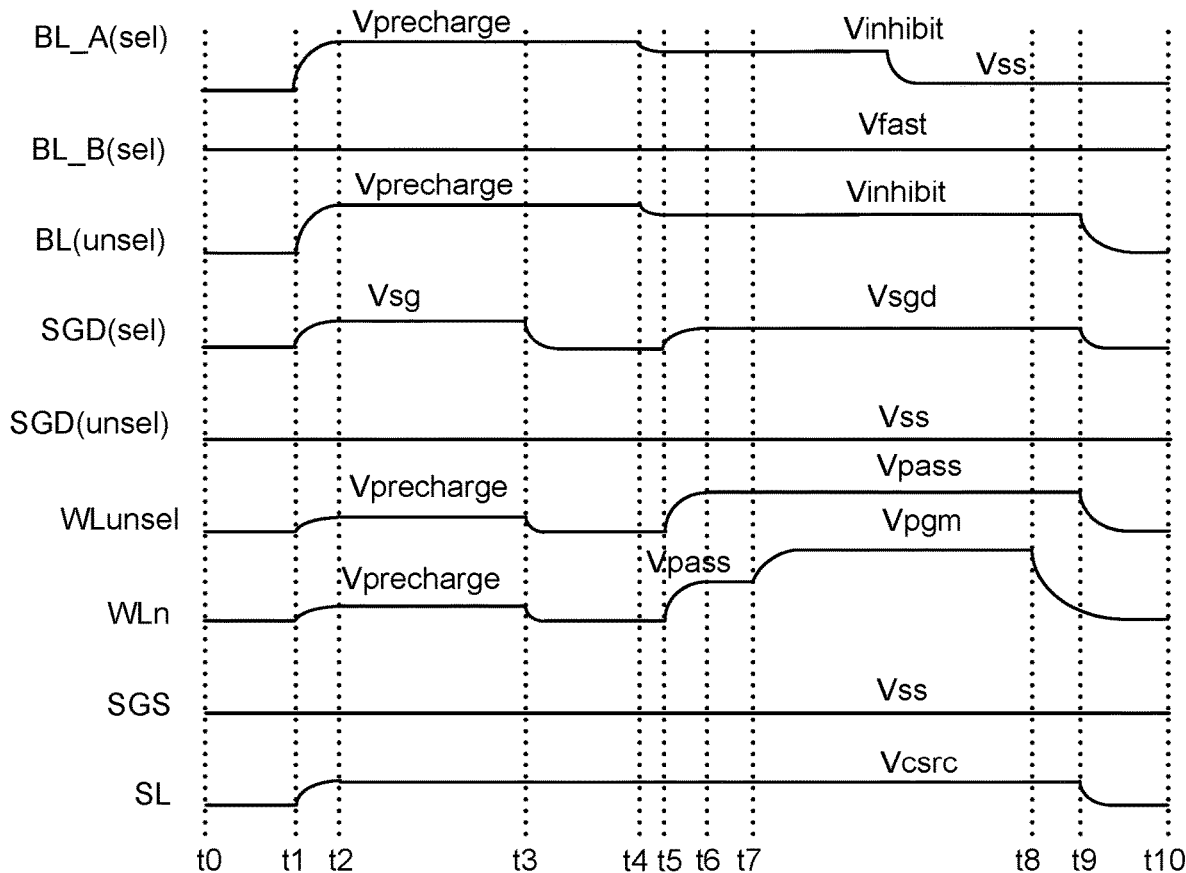

NON-VOLATILE MEMORY WITH MULTI-PLANE MIXED SUB-BLOCK PROGRAMMING

This application claims priority to U.S. Provisional Application 62/668,365, "Program Performance Enhancement For Multi-Plane Mixed Sub-Block Mode," filed on May 8, 2018.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). It is important that the process for programming data into the memory system be fast so that the host device (or other client) does not have to wait very long for the memory system to finish the programming.

BRIEF DESCRIPTION OF THE DRAWINGS

Like-numbered elements refer to common components in the different figures.

FIG. 4D depicts a view of the select gate layers and word line layers.

FIG. 14 is a flow chart describing one embodiment of a process for programming.

FIG. 15 is a flow chart describing one embodiment of a process for programming.

FIG. 16 is a flow chart describing one embodiment of a process for programming.

FIG. 17 is a flow chart describing one embodiment of a process for programming.

FIG. 18 is a flow chart describing one embodiment of a process for programming.

FIG. 21 is a flow chart describing one embodiment of a process for applying different bit line signals to the different bit lines.

FIG. 22 is a signal diagram depicting one embodiment of a process for programming.

FIG. 24 is a flow chart describing one embodiment of a process for programming.

FIG. 25 is a signal diagram depicting one embodiment of a process for programming.

DETAILED DESCRIPTION

In some embodiments, a non-volatile memory system includes a control circuit connected to a memory structure. The memory structure includes a plurality (e.g., millions) of non-volatile memory cells that persistently store data. To increase performance during programming, the plurality of memory cells are arranged in multiple planes such that the memory system can perform programming for multiple planes in parallel; therefore, enabling more memory cells to be programmed during a given time period. To increase efficiency of the system, the various blocks within the multiple planes are divided into sub-blocks such that each sub-block (of the same block or different blocks) can be erased, read and programmed independently. To realize the benefits of multiple planes and the use of sub-blocks a memory system is proposed that simultaneously programs memory cells connected to different word lines that are in different sub-blocks of different blocks in different planes of a die.

Figure 1:
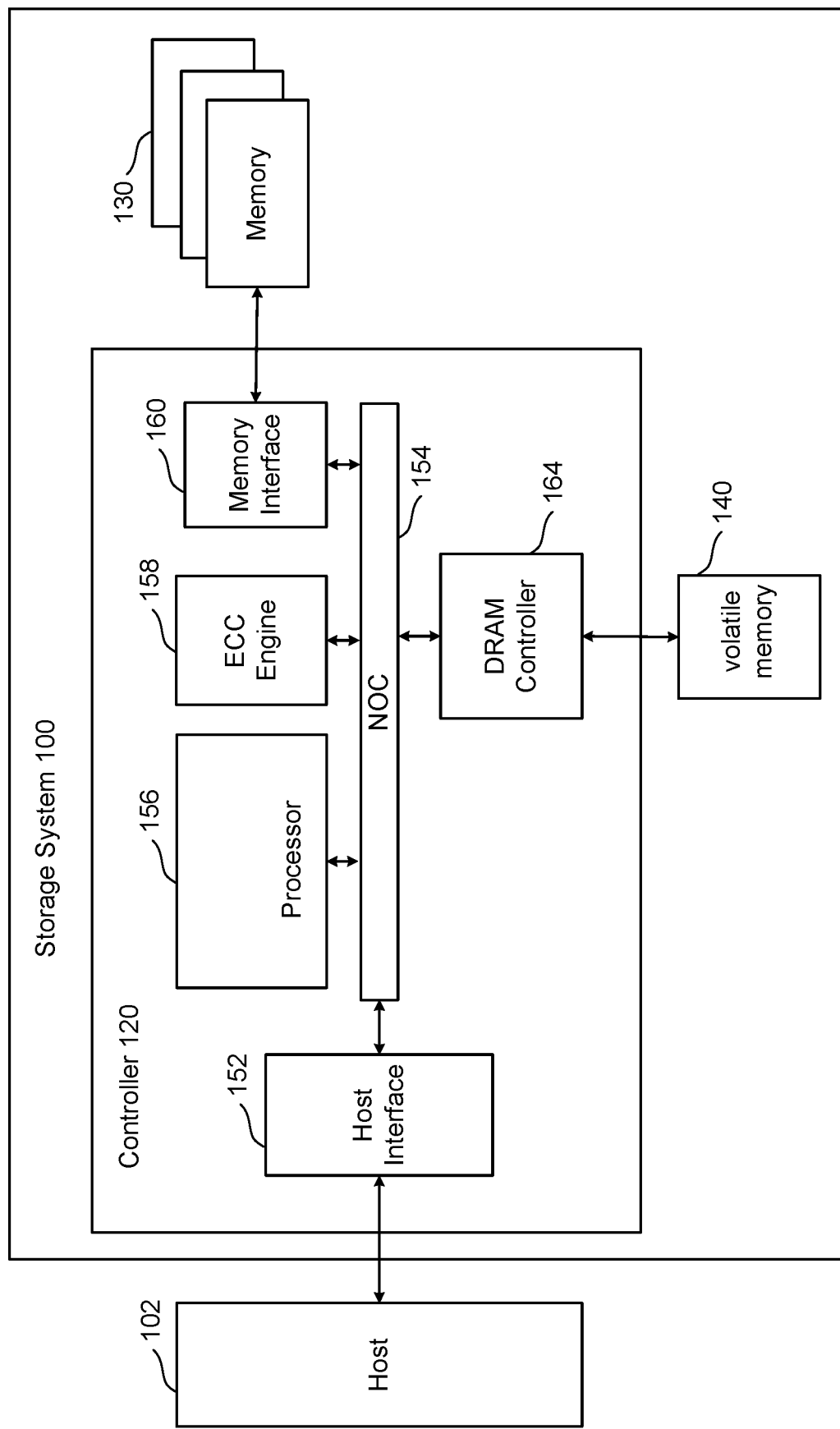
FIG. 1 is a block diagram depicting one embodiment of a memory system.

FIG. 1 is a block diagram of one embodiment of a memory system 100 that implements the proposed technology for simultaneously programming memory cells connected to different word lines that are in different sub-blocks of different blocks in different planes of a die. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below with respect to FIG. 2. Local high speed volatile memory 140 is used by controller 120 to perform certain functions. For example, local high speed volatile memory 140 stores logical to physical address translation tables ("L2P tables.")

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on—hip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
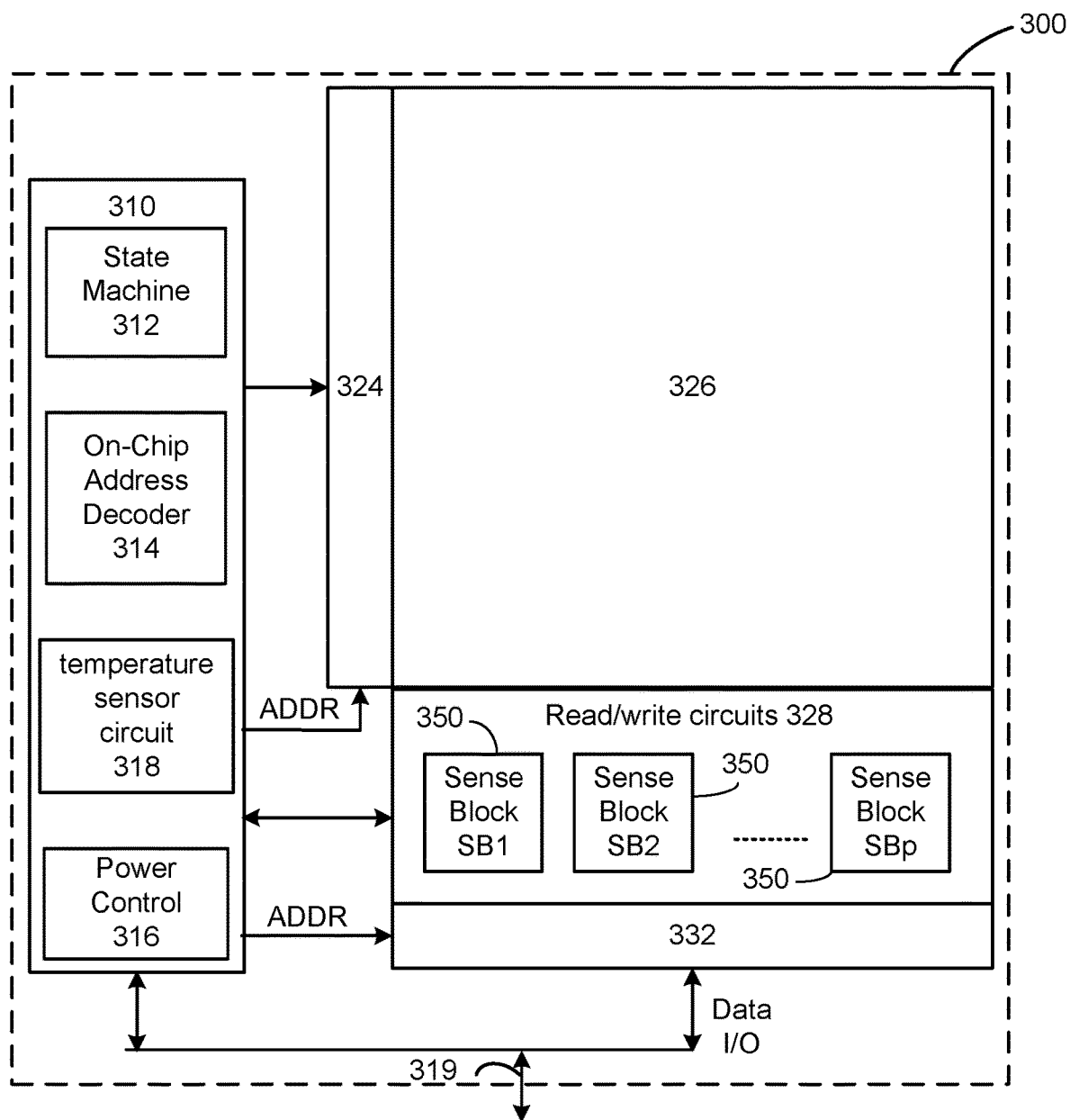
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers. Commands and data are transferred between the controller and the memory die 300 via lines 319. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature sensor circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. Temperature sensor circuit 318 detects current temperature at memory die 300.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise a control circuit for memory structure 326. In other embodiments, other circuits that support and operate on memory structure 326 can be referred to as a control circuit. For example, in some embodiments, the controller can operate as the control circuit or can be part of the control circuit. The control circuit can also be implemented as a microprocessor or other type of processor that is hardwired or programmed to perform the functions described herein.

For purposes of this document, control circuitry 310, read/write circuits 328, and decoders 324/332 comprise peripheral circuits for memory structure 326, as they are not part of memory structure 326 but are on the same die as memory structure 326 and are used to operate memory structure 326.

In one embodiment, memory structure 326 comprises a three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
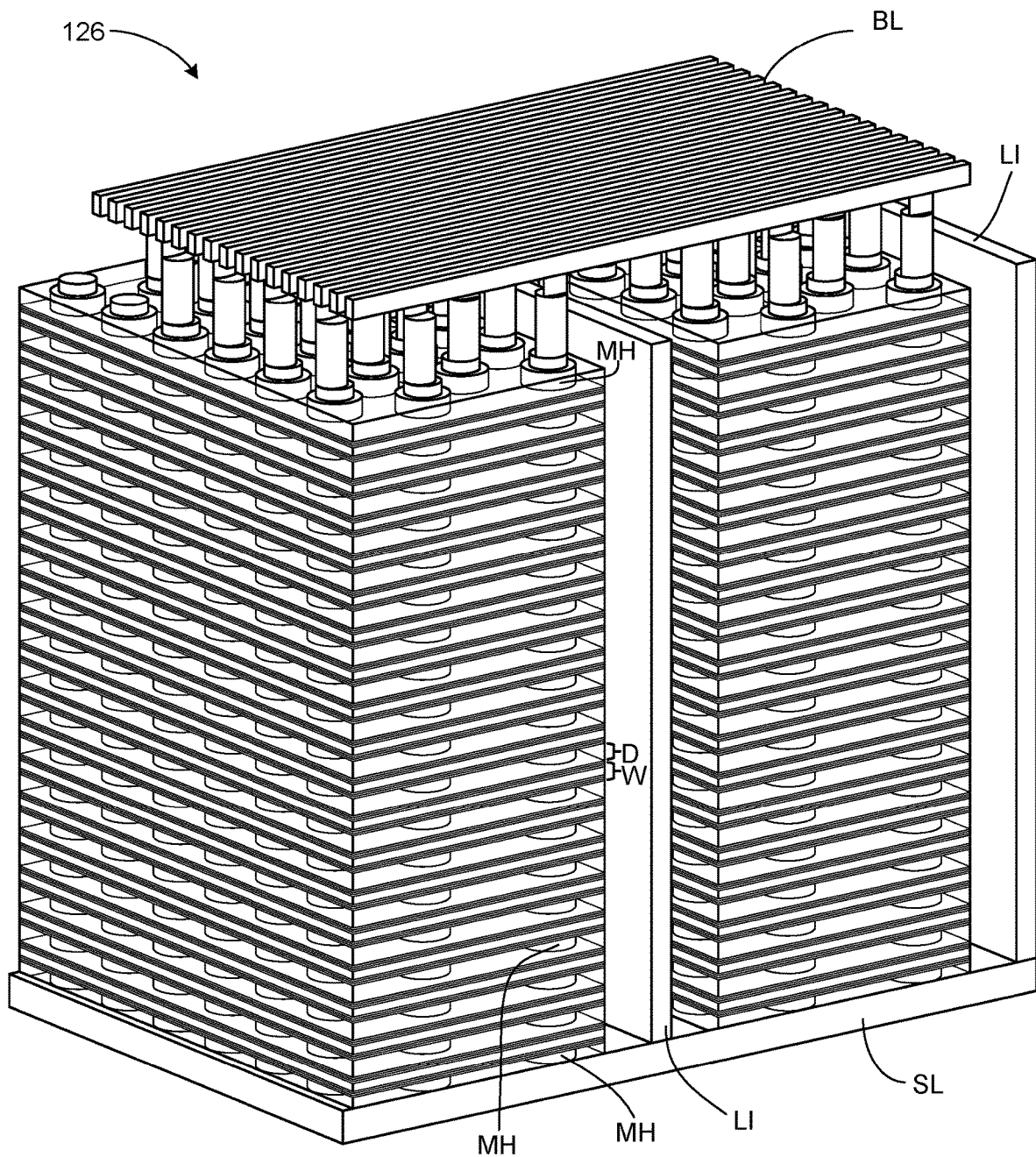
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality non-volatile memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells (also referred to as a memory column). Each memory cell can store one or more bits of data. More details of the three dimensional monolithic memory array that comprises memory structure 126 is provided below with respect to FIG. 4A-4F.

Figure 4A:
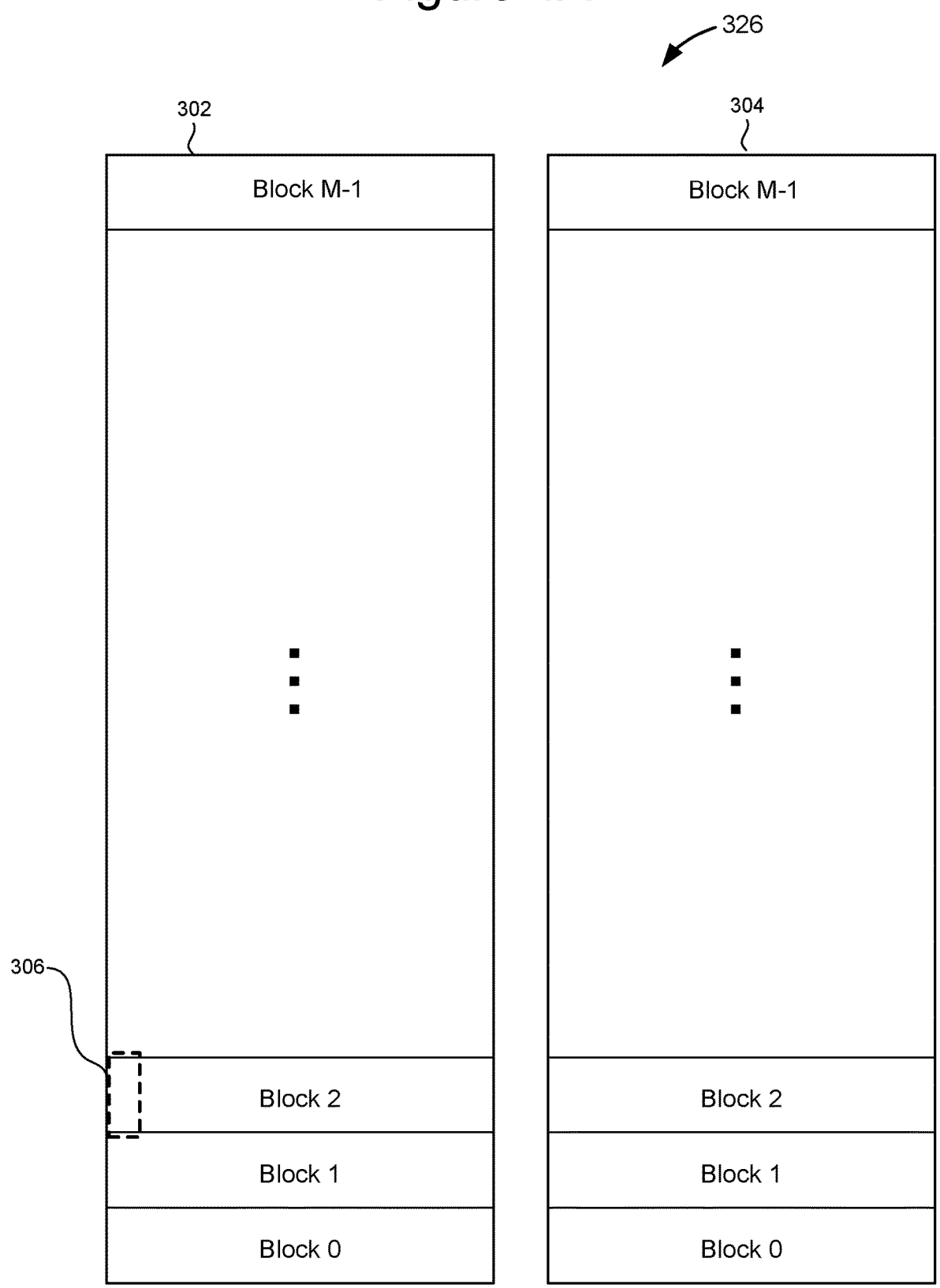
FIG. 4A is a block diagram of a memory structure having two planes.

FIG. 4A is a block diagram explaining one example organization of memory structure 326, which is divided into two planes 302 and 304. Both planes are on the same die 300 (see FIG. 2). Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Although FIG. 4A shows two planes on the same die, in other embodiments more than two planes can be implemented. For example, the memory structure 326 can include 2-8 (or more) planes.

Figure 4B:
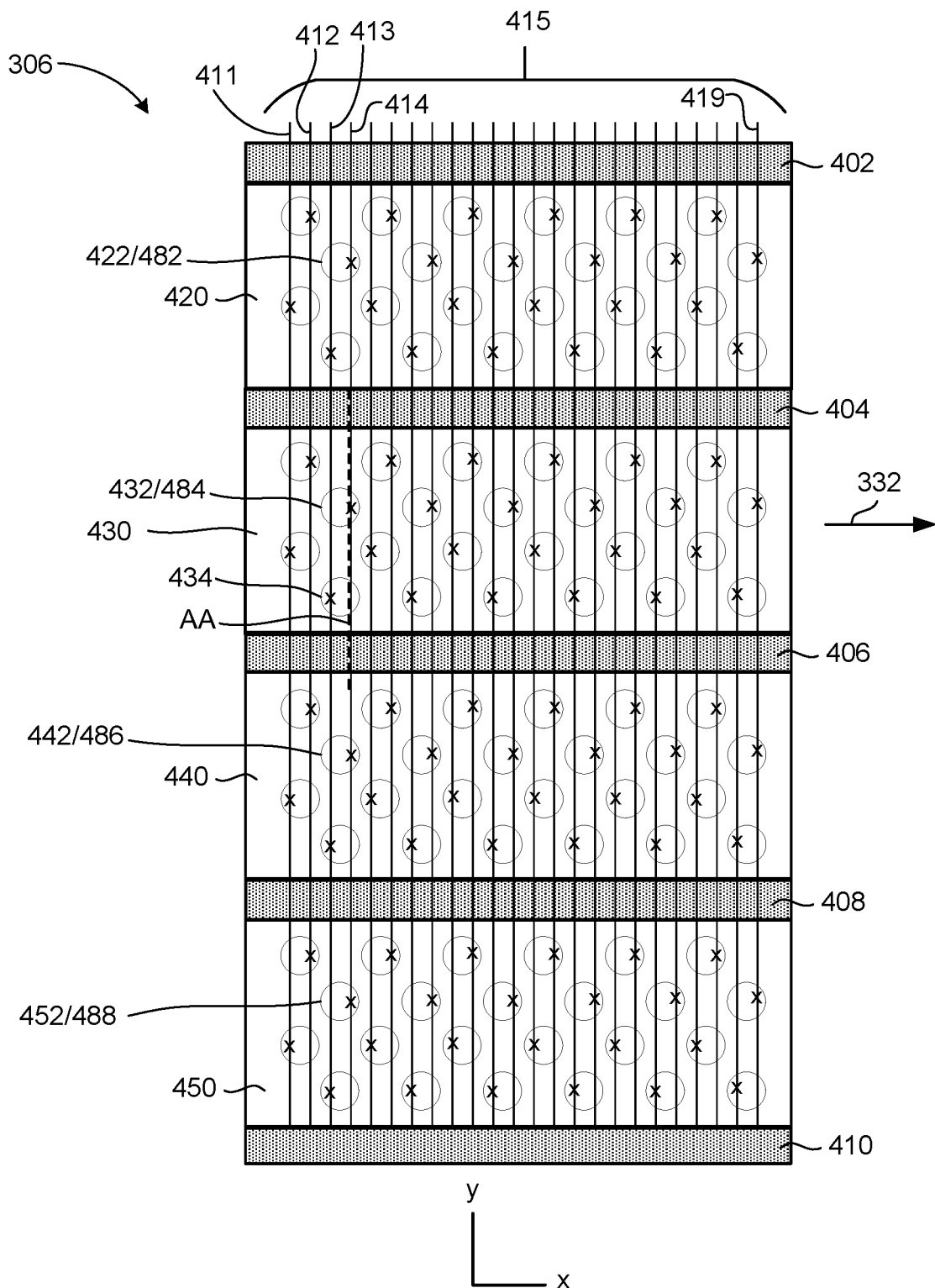
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns, which are also referred to as memory columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, ... 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
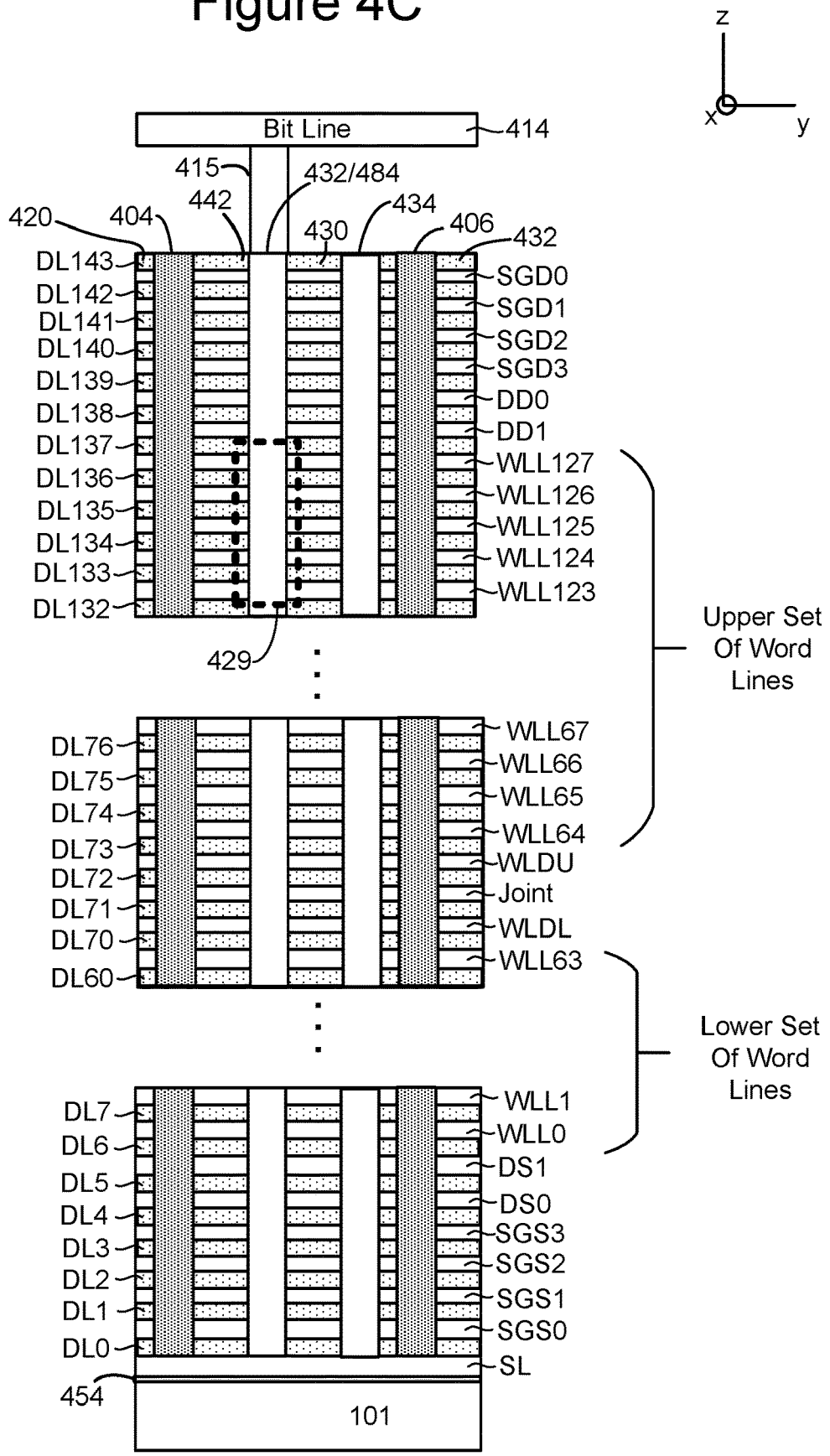
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and one hundred and twenty eight data word line layers WLL0-WLL127 for connecting to data memory cells. Other embodiments can implement more or less than four drain side select layers, more or less than four source side select layers, more or less than six dummy word line layers, and more or less than one hundred and twenty eight word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL127 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL143. For example, dielectric layers DL136 is above word line layer WLL126 and below word line layer WLL127. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL127 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch one hundred and twenty-eight word line layers intermixed with dielectric layers. To ease this burden, one embodiment includes laying down a first stack of sixty four word line layers alternating with dielectric layers, laying down the Joint area, and laying down a second stack of sixty four word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 4C. As mentioned above with respect to FIG. 4B, in one embodiment local interconnects 402, 404, 406, 408 and 410 break up the conductive layers into four regions/fingers. For example, word line layer WLL126 is divided into regions 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
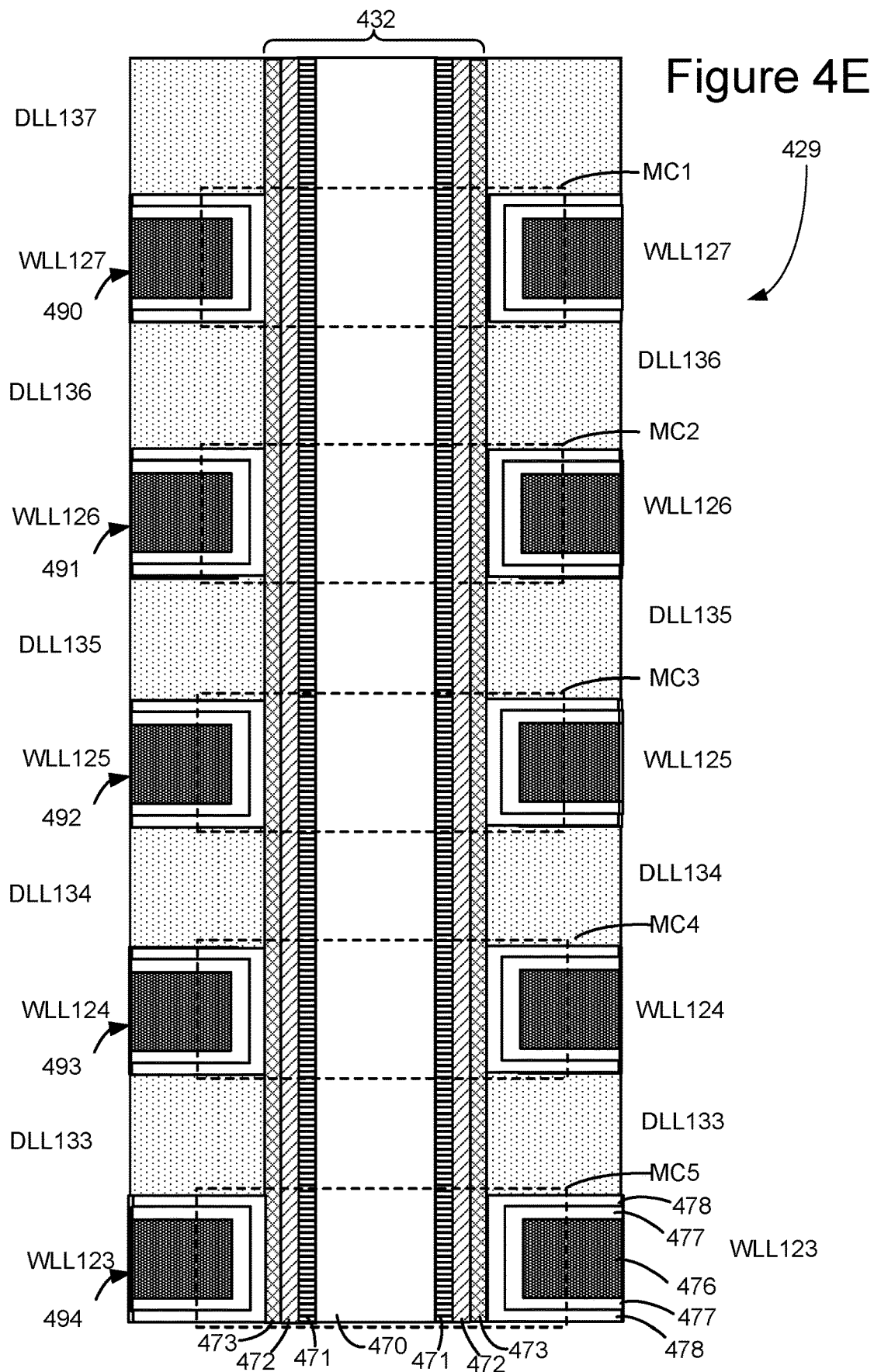
FIG. 4E is a cross sectional view of a vertical column of memory cells.

FIG. 4E depicts a cross sectional view of region 429 of FIG. 4C that includes a portion of vertical column 432 (a memory hole). In one embodiment, the vertical columns are shaped as cylinders; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL137, DLL136, DLL135, DLL134 and DLL133, as well as word line layers WLL127, WLL126, WLL125, WLL124, and WLL123. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL127 and a portion of vertical column 432 comprise a memory cell MC1. Word line layer WLL126 and a portion of vertical column 432 comprise a memory cell MC2. Word line layer WLL125 and a portion of vertical column 432 comprise a memory cell MC3. Word line layer WLL124 and a portion of vertical column 432 comprise a memory cell MC4. Word line layer WLL123 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
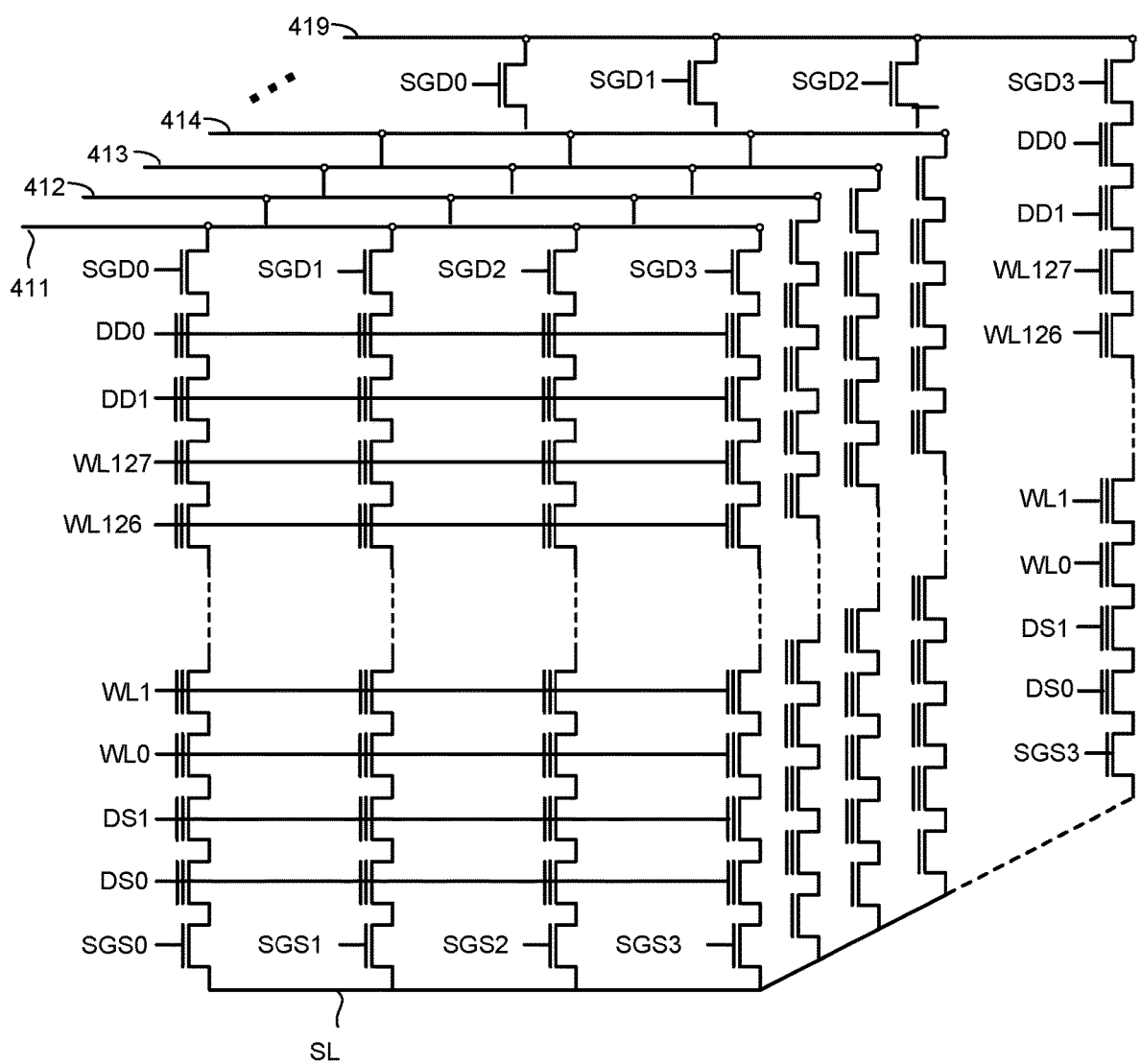
FIG. 4F is a schematic of a plurality of NAND strings.

FIG. 4F is a schematic diagram of a portion of the memory depicted in in FIGS. 3-4E. FIG. 4F shows physical word lines WLL0-WLL127 running across the entire block. The structure of FIG. 4F corresponds to portion 306 in Block 2 of FIGS. 4A-E, including bit lines 411, 412, 413, 414, ... 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIGS. 3-4F is a three dimensional memory structure that includes vertical NAND strings with charge-trapping material, other (2D and 3D) memory structures can also be used with the technology described herein.

Figures 5, 6:
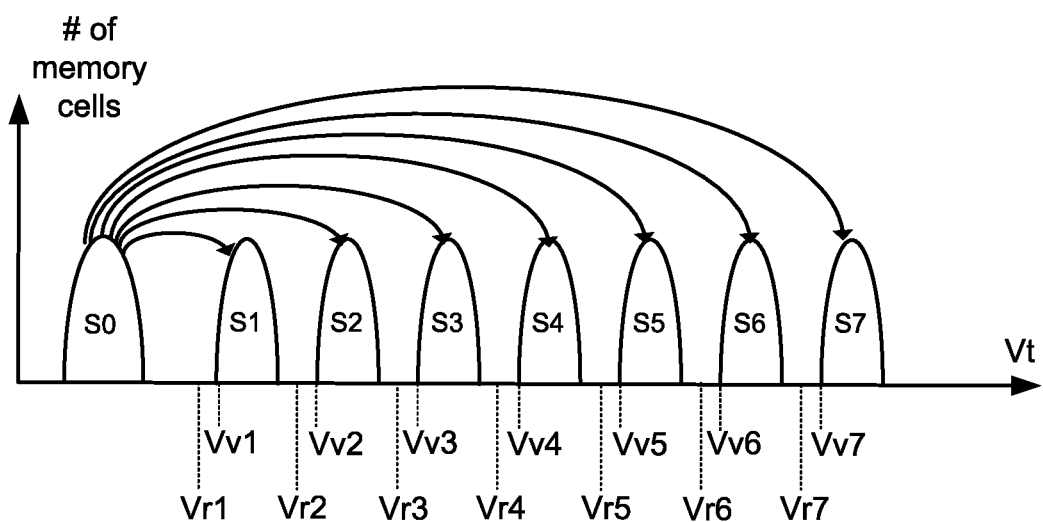
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 122 relying on error correction to identify the correct data being stored.

FIG. 6 is a table describing one example of an assignment of data values to data states. In the table of FIG. 6, S0=111. S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 6, all bits stored in a memory cell are 1 when the memory cell is erased (e.g., in data state S0).

Figure 7:
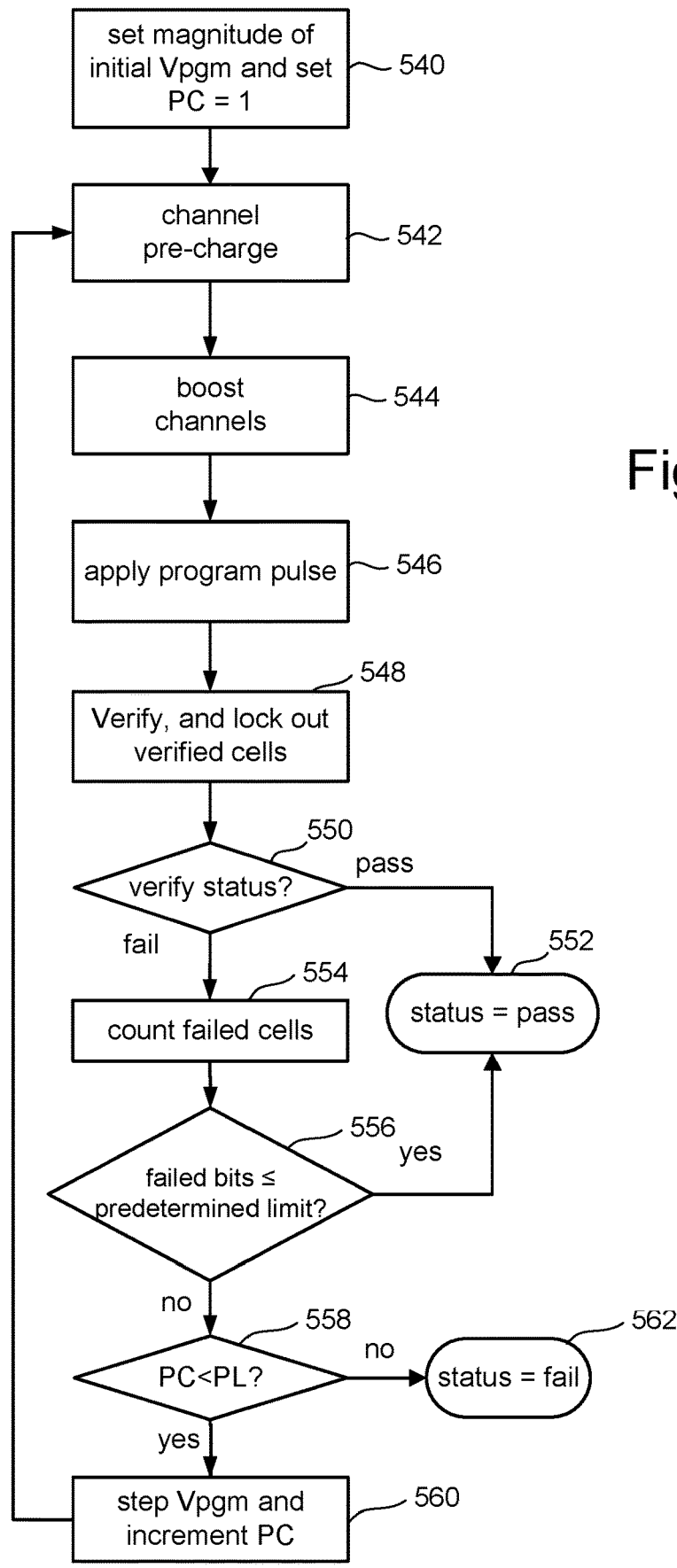
FIG. 7 is a flow chart describing one embodiment of a process for programming non-volatile memory.

FIG. 7 is a flowchart describing one embodiment of a process for programming. In one example embodiment, the process of FIG. 7 is performed on memory die 300 using the control circuit discussed above. For example, the process of FIG. 7 can be performed at the direction of state machine 312. The process of FIG. 7 can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 540 of FIG. 7, the programming voltage (Vpgm) is initialized to the starting magnitude (e.g., ~12-16V or another suitable level) and a program counter PC maintained by state machine 312 is initialized at 1.

In one embodiment, the group of memory cells in a same block that are selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with state S0 so they will not be programmed. Additionally, as memory cells reach their intended target data state, they will be inhibited from further programming. Those NAND strings that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 542 the memory system will pre-charge channels of NAND strings that include memory cells connected to the selected word line that are to be inhibited from programming. In some embodiments, only the drain side of the channel is pre-charged. By "drain side" it is meant the portion of the NAND string on the same side of the selected word line as the bit line connection.

In step 544, NAND strings that include memory cells connected to the selected word line that are to be inhibited from programming have their channels boosted to inhibit programming. In one embodiment, the unselected word lines receive one or more boosting voltages (e.g., ~7-11 volts) to perform boosting schemes known in the art.

In step 546, a program pulse of the program signal Vpgm is applied to the selected word line (the word line selected for programming). If a memory cell should be programmed, then the corresponding bit line is grounded. On the other hand, if the memory cell should remain at its current threshold voltage, then the corresponding bit line is connected to Vdd to inhibit programming. In step 546, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 546, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 548, it is determined whether all the memory cells have reached their target threshold voltages (pass). If so, the programming process is complete and successful because all selected memory cells were programmed and verified to their target states. A status of "PASS" is reported in step 552. If, in 550, it is determined that not all of the memory cells have reached their target threshold voltages (fail), then the programming process continues to step 554.

In step 554, the memory system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 556, it is determined whether the count from step 554 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 552. In this situation, enough memory cells programmed correctly such that the few remaining memory cells that have not been completely programmed can be corrected using ECC during the read process. In some embodiments, the predetermined limit used in step 556 is below the number of bits that can be corrected by error correction codes (ECC) during a read process to allows for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 558 and the program counter PC is checked against the program limit value (PL). Examples of program limit values include 6, 12, 16, 20 and 30; however, other values can be used. If the program counter PC is not less than the program limit value PL, then the program process is considered to have failed and a status of FAIL is reported in step 562. If the program counter PC is less than the program limit value PL, then the process continues at step 560 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 560, the process loops back to step 542 and another program pulse is applied to the selected word line so that another iteration (steps 542-560) of the programming process of FIG. 7 is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. That is, other read and verify techniques known in the art can also be used.

As described above, one embodiment of a memory structure includes NAND strings that are formed by filling the memory holes with materials including a charge-trapping material to create vertical columns of memory cells (also referred to as memory column). For example, FIGS. 4C and 4E depicts cross sections of vertical column 432. FIGS. 4C and 4E show the vertical column in the shape of a cylinder with perfectly vertical sides. However, in some implementations, the vertical columns have sides that are angled. That is, the vertical columns increase in diameter along the vertical axis from bottom to top. For the embodiments that have lower sets of vertical columns below the Joint area and upper sets of vertical columns above the Joint area (see FIG. 4C), then the plurality of lower vertical (memory) columns and the plurality of upper vertical (memory) columns increase in diameter along the vertical axis from bottom to top. This situation is graphically depicted in FIG. 8, which shows vertical (memory) column 432 divided into a lower memory column LMC and an upper memory column UMC, both of which have sides that are angled such that the column increases in diameter along the vertical axis from bottom to top. The diameter of the lower memory column LMC is larger at the top as compared to the bottom. The diameter of the upper memory column UMC is larger at the top as compared to the bottom.

One step in the process flow to manufacture the memory is the memory hole etch, which defines the lateral shape of the memory cell. Ideally, the etch would be perfectly vertical. However, in reality for some embodiments, the etch is angled. This means that lower layers tend to have memory cells with smaller diameters. It has been observed that memory cells with smaller diameters program faster than memory cells with larger diameters. Therefore, as programming progresses from the lowest physical word line WL0 to the highest physical word line WL63 of the lower column, the programming speed slows down. This pattern of faster to slower repeats when programming memory cells connected to word lines WL64-WL127. To speed up the slower memory cells on higher word lines, a programing voltage with a higher initial Vpgm (see step 540) can be used. However, to maintain reliability of the programming of faster memory cells on lower word lines, a programing voltage with a lower initial Vpgm (see step 540) should be used. To accommodate this systemic variation, the memory system can set different initial Vpgm for different word lines. This helps optimize performance and reliability.

Figure 8:
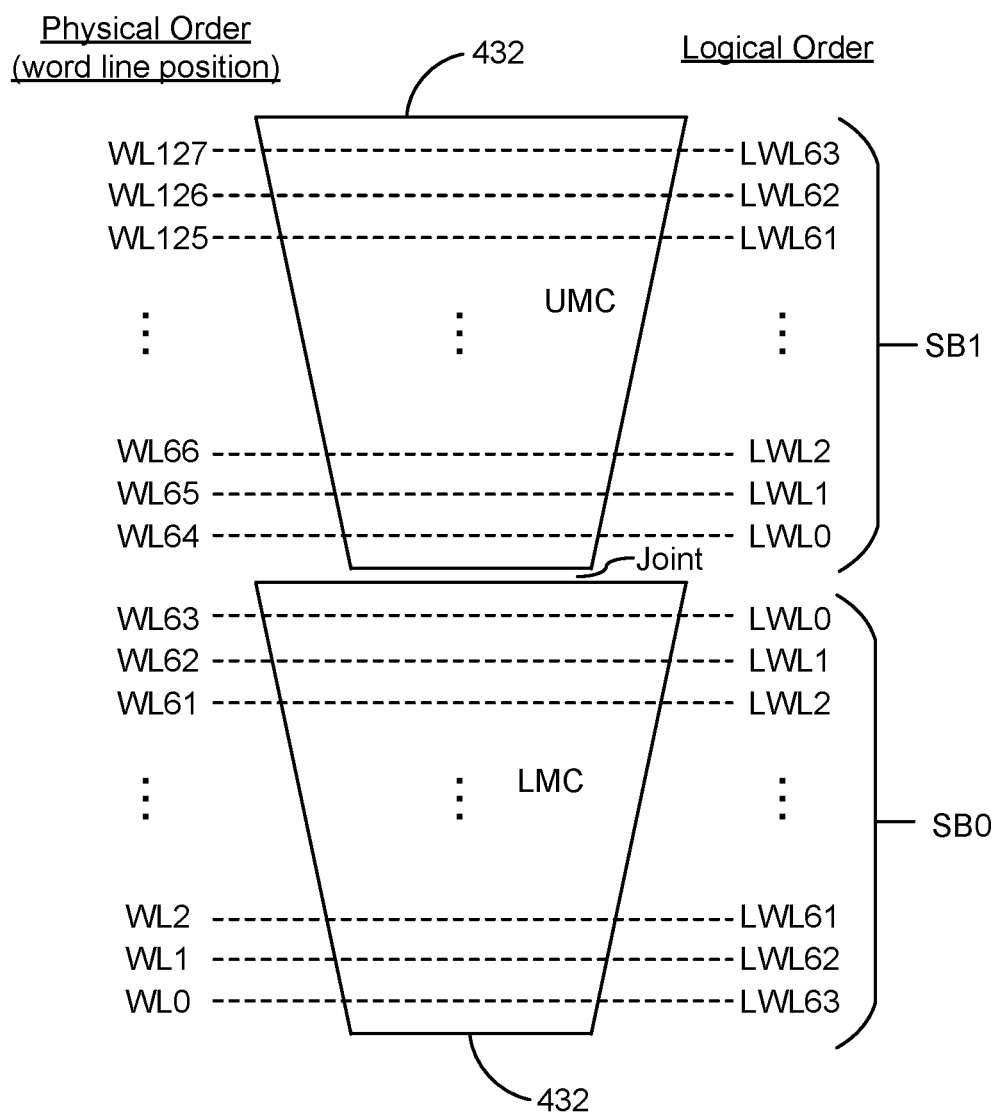
FIG. 8 is a block diagram depicting a vertical column of memory cells.

In the past, memory systems typically erase an entire block before the block can be programmed. For more efficient usage, the memory system is logically divided into two or more sub-blocks. Then, each sub-block can be erased, read and programmed independently. In one embodiment, the blocks are divided into two sub-blocks: a lower sub-block SB0 and an upper sub-block SB1. In one embodiment, the lower sub-block SB0 includes all of the word lines below the Joint area and all of the memory cells connected to those word lines. In one embodiment, the upper sub-block SB1 includes all of the word lines above the Joint area and all of the memory cells connected to those word lines. FIG. 8 shows vertical column 432 with physical word lines WL0-WL127 divided into the lower sub-block SB0 (including WL0-WL63) and the upper sub-block SB1 (including WL64-WL127). In one embodiment, each sub-block of a block has a non-intersecting set of word lines as compared to other sub-blocks of the block. That is, the word lines in one sub-block are not also in another sub-block of the same block. In some embodiments, each NAND string is located in multiple sub-blocks of a same block.

In order to achieve better reliability, the programming order for programming sub-blocks starts in the middle and extends outward. For example, the left side of FIG. 8 labels the word lines in physical order, indicating word line position from WL0 at the bottom to WL127 at the top while the right side of FIG. 8 labels the word lines in logical order for each sub-block starting in the middle at LWL0 for each sub-block SB0/SB1 and extending outward to LWL63 for each sub-block. Thus, in the example of FIG. 8, logical word line LWL63 constitutes the bottom-most and top-most word lines.

The sub-block arrangement of FIG. 8 allows for the erasing of half of the block's word lines, while maintaining the data in the memory cells connected to the other half of the block's word lines.

In multi-plane programming, two or more planes are programmed at the same time. For example, one block from a first plane is programmed simultaneously with the programming of a block from a second plane. In one situation, the programming is performed on the same word line and in the same sub-block in both planes. For example, both planes can be programming logical word line LWL2 of the lower sub-block SB0.

In another embodiment, the system may program different word lines in different sub-blocks in different blocks of the different planes. For example, the first plane may receive programming for memory cells connected to logical word line LWL2 of the lower sub-block SB0 of a selected block while the second plane may receive programming for memory cells connected to logical word line LWL2 of the upper sub-block SB1 of a selected block in the second plane. The two logical word lines are different word lines because they are different physical word lines.

Figure 9:
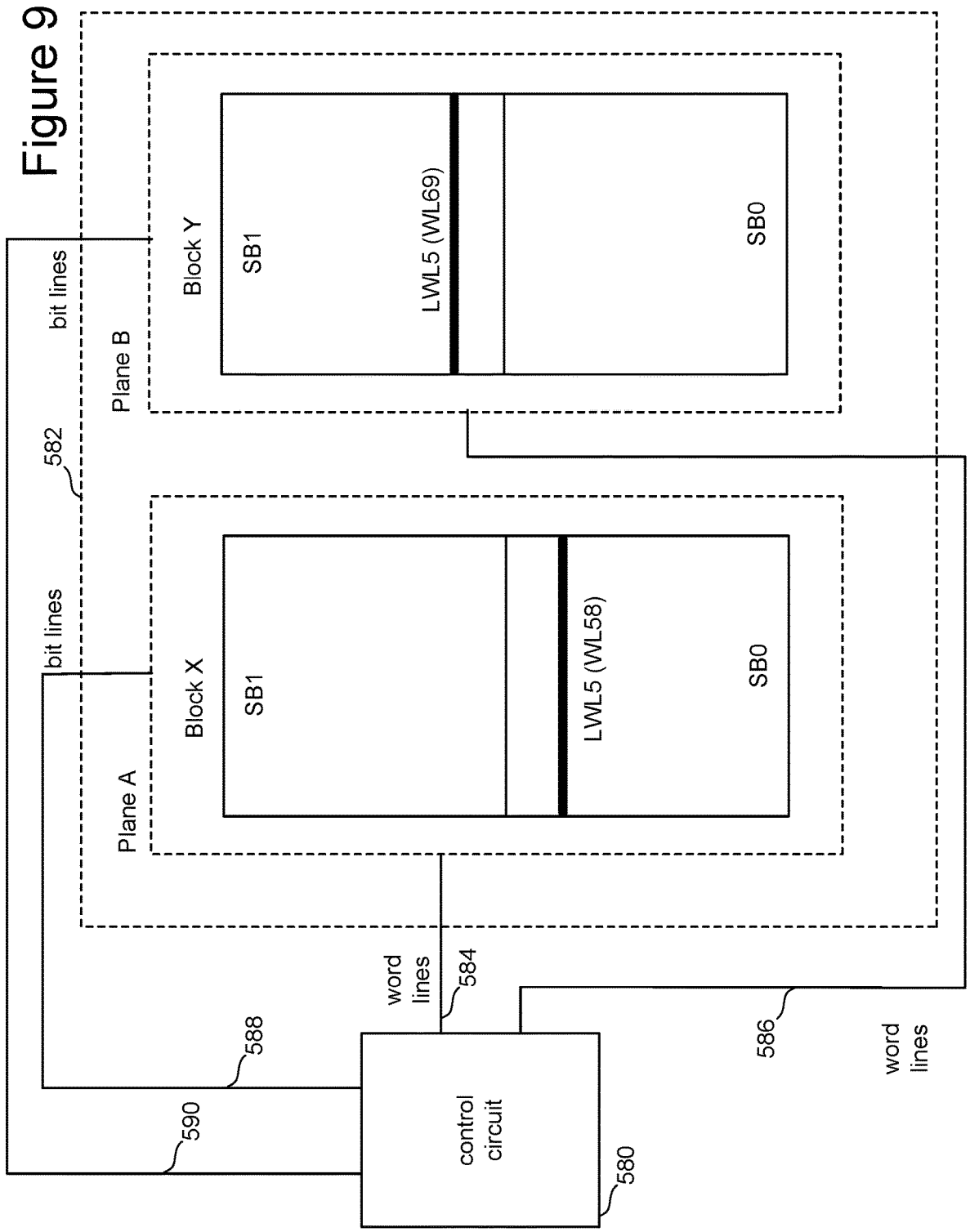
FIG. 9 is a block diagram depicting portions of a memory system that simultaneously programs memory cells connected to different word lines that are in different sub-blocks of different blocks in different planes of a die.

FIG. 9 depicts a control circuit 580 connected to a memory structure 582 that includes two planes: Plane A and Plane B. In one embodiment, memory structure 582 is the memory structure 326 of FIG. 1. Although Planes A and B have many blocks, only Block X of Plane A and Block Y of Plane B are depicted to make the drawing easier to read. Block X and Block Y each have two sub-blocks: SB0 and SB1. Word lines 584 connect from control circuit 580 to Block X of Plane A. Word lines 586 connect from control circuit 580 to Block Y of Plane B. Bit lines 588 connect from control circuit 580 to Block X of Plane A. Bit lines 590 connect from control circuit 580 to Block Y of Plane B. In one embodiment, control circuit 580 includes control circuitry 310, read/write circuits 328 and decoders 324/332 described above with respect to FIG. 2. In other embodiments, other circuits that support and operate on memory structure 326 can be used as the control circuit. For example, in some embodiments, the controller can operate as the control circuit 580 or can be part of the control circuit 580. Control circuit 580 can also be implemented as a microprocessor, microcontroller or other type of processor that is hardwired or programmed to perform the functions described herein.

In the example of FIG. 9, the control circuit 580 is configured to simultaneously program memory cells connected to different word lines that are in different sub-blocks of different blocks in different planes of a die. For example, FIG. 9 shows the simultaneous programming of memory cells connected to LWL5 (WL58) of sub-block SB0 of block X of Plane A and memory cells connected to LWL5 (WL69) of sub-block SB1 of block Y of Plane B. The ability to independently erase, read and program sub-blocks allows for more efficient use of the memory system's storage capacity.

When programming memory cells to different word lines that are in different sub-blocks of different blocks in different planes of a die, each of the word lines needs to receive a programming voltage Vpgm (see FIG. 7). Because the word lines are in different sub-blocks of different blocks (and likely to be at different word line positions), it is likely that one of the word lines will program faster than the other word line due to the different word line position. Looking back at FIG. 8, word lines at different word line positions may connect to the vertical columns at portions of the vertical columns with different diameters, thereby, connecting to memory cells that program at different speeds. Therefore, the different word lines that are in different sub-blocks of different blocks in different planes should receive different programing voltages Vpgm that have different starting magnitudes of the initial Vpgm. The word line connected to faster memory cells should receive a Vpgm that starts at a lower initial voltage (magnitude of initial voltage pulse) and the word line connected to slower memory cells should receive a Vpgm that starts at a higher initial voltage.

Figure 10:
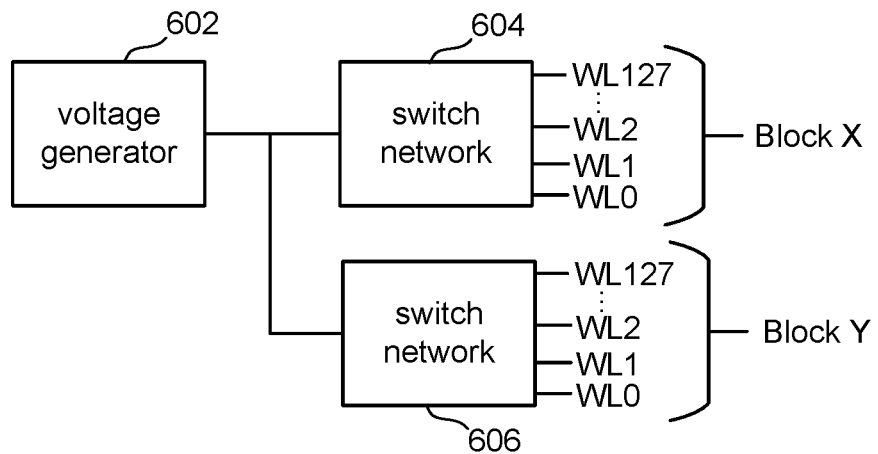
FIG. 10 is a block diagram depicting voltage sources for simultaneously programming memory cells connected to different word lines that are in different sub-blocks of different blocks in different planes of a die.
Figure 11:
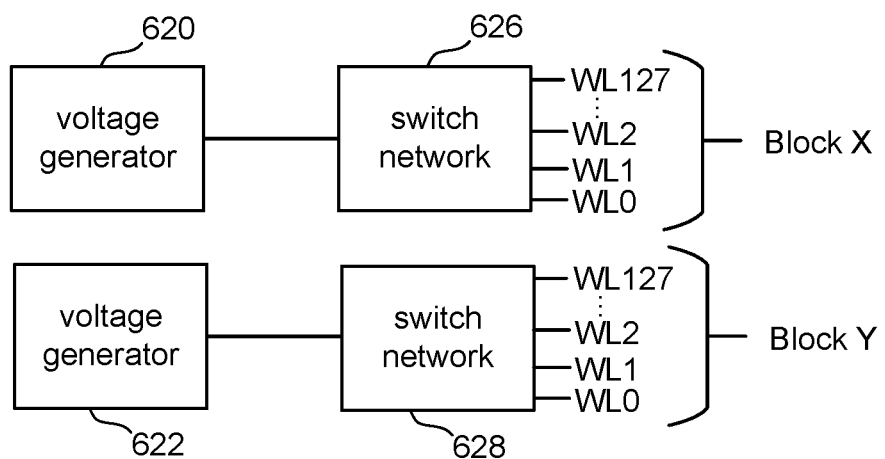
FIG. 11 is a block diagram depicting voltage sources for simultaneously programming memory cells connected to different word lines that are in different sub-blocks of different blocks in different planes of a die.

FIGS. 10-13 are block diagrams depicting various embodiments of voltage sources for simultaneously programming memory cells connected to different word lines that are in different sub-blocks or different blocks in different planes of a die. Each of the components of FIGS. 10-13 are part of control circuit 580 of FIG. 9. FIG. 10 shows voltage generator 602 connected to switch network 604 and switch network 606. Voltage generator 602 is an electrical circuit that generates a voltage. In one embodiment, voltage generator 602 includes a charge pump. The output of switch network 604 connects to each of word lines WL0-WL127 of block X in plane A of memory structure 582 of FIG. 9. In one embodiment, memory structure 582 of FIG. 9 is an example implementation of memory structure 326 of FIG. 2. The output of switch network 606 is connected to each of word lines WL0-WL127 of Block Y of Plane B of memory structure 582 of FIG. 9. Switch network 604 receives a voltage on its input and includes a series of switches to selectively provide that voltage on any one of WL0-WL127 of Block X. Switch network 606 receives the same voltage that switch network 604 receives from voltage generator 602 and uses a series of internal switches to provide that received voltage to one of WL0-WL127 of Block Y. Therefore, in the embodiment of FIG. 10, the selected word line for programming in Block X (e.g. WL58) and the selected word line in Block Y (e.g. WL69) will receive the same voltage from the single voltage generator 602. Thus, in this embodiment, the two word lines in two separate planes that are simultaneously being programmed will receive the same programming voltage Vpgm. However, as discussed above, it is likely that, for optimum performance and reliability, the two word lines will require different programming voltages to account for different speeds of programming of the memory cells connected to those word lines. Therefore, FIG. 11 provides an embodiment where each block of the two blocks being simultaneously programmed will have its own voltage generator.

FIG. 11 shows voltage generator 620 and voltage generator 622. Voltage generator 620 is connected to switch network 626. Voltage generator 622 is connected to switch network 628. In one embodiment, switch network 626 is a circuit that includes a series of internal switches that take the received voltage from voltage generator 620 and present that received voltage to one of WL0-WL127 of Block X. Switch network 628 includes a series of internal switches that take the input voltage received from voltage generator 622 and present that input voltage to one of WL0-WL127 of Block Y. Voltage generator 620, voltage generator 622, switch network 626 and switch network 628 are all part of control circuit 580 of FIG. 9. In the embodiment of FIG. 11, each of the blocks (Block X and Block Y) have its own voltage generator so that they can receive separate and different programming voltages that start at different initial magnitudes. In the example of FIG. 9, voltage generator 620 provides a first programming voltage to WL58 of Block X and voltage generator 622 provides a second programming voltage with a second initial magnitude to word line WL69 of Block Y.

The embodiment of FIG. 11 includes a first voltage source (voltage generator 620) generating a first word line voltage signal for programming and a second voltage source (voltage generator 622) generating a second word line voltage signal for programming that is different in magnitude at a same moment in time as the first word line voltage signal such that a memory cell connected to a word line of a first set of word lines can be programmed with the first word line voltage signal simultaneously with a memory cell connected to a word line of a second set of word lines being programmed with the second word line voltage signal.

Figure 12:
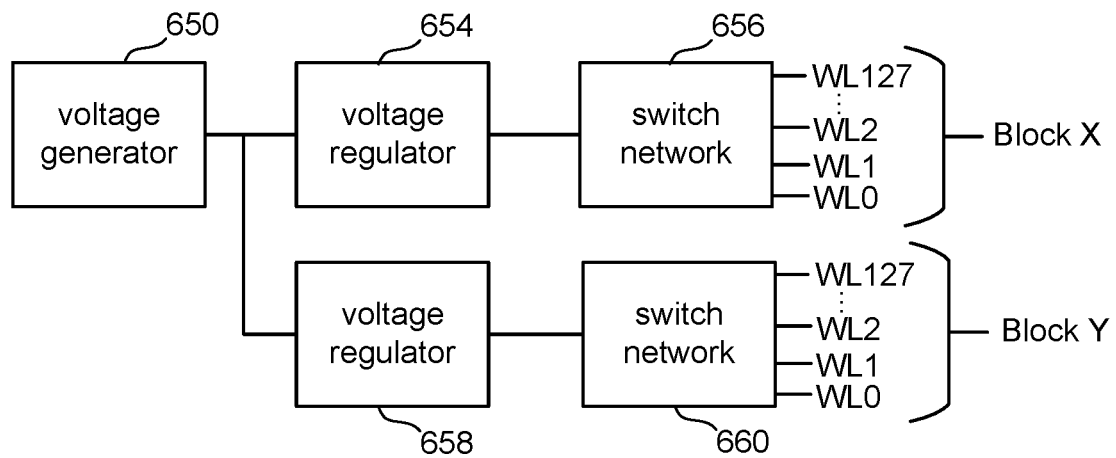
FIG. 12 is a block diagram depicting voltage sources for simultaneously programming memory cells connected to different word lines that are in different sub-blocks of different blocks in different planes of a die.

FIG. 12 provides another embodiment for providing two different programming voltages having two different starting initial magnitudes to two different blocks being simultaneously programmed. In the embodiment of FIG. 12, one voltage generator 650 is used. The output of voltage generator 650 is provided to voltage regulator 654 and voltage regulator 658. For purposes of this document, a voltage regulator is a circuit that receives a high voltage at its input and is able to output a lower voltage in a stable manner. A voltage regulator can be thought of as a voltage source. The output of voltage regulator 654 is provided to the switch network 656. The output of voltage regulator 658 is provided to switch network 660. Switch network 656 will present the output of voltage regulator 654 to one of word lines WL0-WL127 of Block X. Switch network 660 will provide the output of voltage regulator 658 to one of word lines W10-WL127 of block Y. In this manner, voltage generator 650 generates a single voltage. Then, the two voltage regulators are used to lower that voltage to two different starting magnitudes for two different voltage signals provided to the two different blocks. In one embodiment, it is possible that one of the voltage regulators can simply pass the voltage without lowering the received voltage so that one of the blocks will receive the actual voltage generated from voltage generator 650 and the other block will receive a stepped-down version. In one embodiment, voltage generator 650, voltage regulator 654, switch network 656, voltage regulator 658, and switch network 680 are all part of control circuit 580 of FIG. 9.

Figure 13:
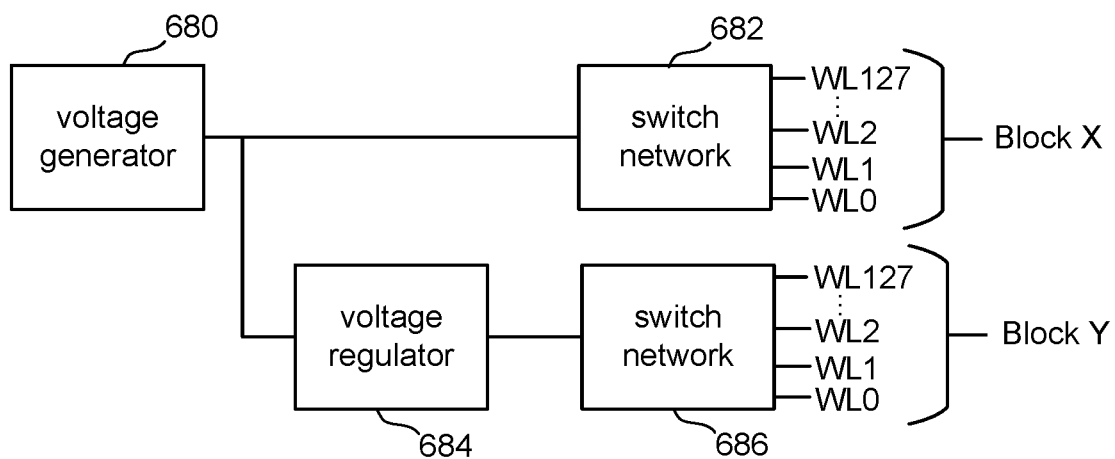
FIG. 13 is a block diagram depicting voltage sources for simultaneously programming memory cells connected to different word lines that are in different sub-blocks of different blocks in different planes of a die.

FIG. 13 provides another embodiment of the components to provide voltages for the selected word lines during programming. FIG. 13 shows a single voltage generator 680. The output of voltage generator 680 is provided to switch network 682, which takes its received voltage and presents it to one of WL0-WL127 of Block X. The output of voltage generator 680 is also provided to voltage regulator 684, which lowers the received voltage to a stepped-down version. The output of voltage regulator 684 is provided to switch network 686, which provides its received voltage from voltage regulator 684 to one of WL0-WL127 of Block Y. In this manner, the selected word line of Block X will receive the output of voltage generator 680 and the selected word line of Block Y will receive a lower voltage. In one embodiment, voltage generator 680, switch network 682, voltage regulator 684 and switch network 686 are all part of control circuit 580.

As discussed above, in one example embodiment, the programming voltage is a series of voltage pulses. The embodiments of FIGS. 11, 12 and 13 allow for the creation of two programming signals. Thus, the system creates two sets of one or more voltage pulses with the first set of one or more voltage pulses having a first magnitude for a first voltage pulse and the second set of one or more voltage pulses have a second magnitude for its first voltage pulse, with the two first magnitudes being different.

FIG. 14 is a flowchart describing one embodiment of a process for programming. The process of FIG. 14 can be used to operate the circuit of FIG. 9, which is a logical representation of the components of FIG. 1 and/or FIG. 2. In one embodiment, the process of FIG. 14 is performed by control circuit 580. For example, in step 702, control circuit 580 simultaneously programs memory cells connected to different word lines that are in different sub-blocks of different blocks in different planes of a same memory die. Control circuit 580 can include any of the embodiments of FIGS. 10-13 to accomplish step 702.

FIG. 15 is a flowchart describing one embodiment of a process of programming. The process of FIG. 15 is example operation of the circuit of FIG. 9. The flowchart of FIG. 15 also represents one example embodiment of the process of FIG. 14. In the example of FIG. 15, control circuit 580 can implement the structures of FIGS. 10-14.

In step 720, control circuit 580 (or other components) program a first set of non-volatile memory cells connected to a first word line in a lower sub-block of a block in a first plane on a die. In step 772, simultaneously with step 720 (simultaneously with programming the first non-volatile memory cells), the control circuit (or other components) program a second set of non-volatile memory cells connected to a second word line in an upper sub-block of a block in a second plane on the die. For example, step 720 can include programming memory cells connected to WL58 of FIG. 9 while step 722 can include simultaneously programming memory cells connected to WL69 of FIG. 9. Note that WL58 is in lower sub-block SB0 of Block X of Plane A while WL69 is in the upper sub-block SB1 of Block Y of Plane B. Both Plane A and Plane B are in the same memory structure 582 on the same memory die 300 (see FIG. 2).

FIG. 16 is a flowchart describing one embodiment of a process for programming. For example, the process of FIG. 15 is an example operation of the components of FIG. 9 and represents more details of one example implementation of FIG. 14 and/or FIG. 15. In one embodiment, the process of FIG. 16 is performed by control circuit 580. In step 750, control circuit 580 applies a same selected bit line voltage to selected bit lines in selected blocks in both planes and a same inhibit voltage to unselected bit lines in the selected blocks in both planes. As discussed herein, not every NAND string in a block or sub-block will be selected for programming. For those NAND strings that are not selected for programming, the bit lines connected to those NAND strings are unselected bit lines and will receive the inhibit voltage that is used to prevent programming for those NAND strings. Those NAND strings that are supposed to be programmed (selected NAND strings) are connected to bit lines that are referred to as selected bit lines and will receive a selected bit line voltage which is appropriate to allow the connected NAND string to be programmed. Therefore, in the embodiment of FIG. 16, the two blocks in different planes being simultaneously programmed will receive the same bit line voltages for inhibit and the same bit line voltages for programming. For example, bit lines 590 and 588 will include the same inhibit voltages and the same selected bit line voltages.

In step 752 of FIG. 16, control circuit 580 programs a first set of non-volatile memory cells connected to a first word line in a lower sub-block of a block in a first plane on a die by applying a first set of one or more voltage pulses to the first word line. The first set of one or more voltage pulses include a first magnitude for a first voltage pulse of the first set of one or more voltage pulses. The system is using different starting voltages for different word lines. In step 754, control circuit 580, simultaneously with programming the first set of non-volatile memory cells in step 752, programs a second set of non-volatile memory cells connected to a second word line in an upper sub-block of a block in a second plane on the die by applying a second set of one or more voltage pulses to the second word line. The second set of one or more voltage pulses include a second magnitude for a first voltage pulse of the second set of one or more voltage pulses. The second magnitude is different than the first magnitude. For example, step 752 includes programming the memory cells connected to word line WL58 of SB0 of Block X of Plane A and step 754 includes programming memory cells connected to WL69 of sub-block SB1 of Block Y of Plane B. In the embodiment of FIG. 16, control circuit 580 can implement the structures of FIG. 11, 12 or 13.

In the embodiments of FIGS. 11, 12 and 13, the control circuit 580 has to include multiple voltage generators, multiple voltage regulators, or a voltage regulator and a voltage generator. As a result, these embodiments require extra hardware on the memory die. In some instances, space on the memory die is at a premium. Therefore, additional embodiments seek to minimize the amount of space utilized on the memory die. For example, FIG. 10 shows only one voltage generator 602 and no voltage regulators. Therefore, the embodiment of FIG. 10 saves space. However, the embodiment of FIG. 10 does not allow for different programming voltages to be applied to the two different blocks being simultaneously programmed. Rather, in the embodiment of FIG. 10, the two word lines being simultaneously programmed that are in different sub-blocks of different blocks in different planes will receive the exact same voltage from the same voltage source. (e.g., voltage generator 602). Therefore, to enable one of the word lines to have its programming slowed down (or sped up), the system will vary the bit line voltages accordingly.

FIG. 17 is a flowchart describing one embodiment of a process for programming memory cells connected to different word lines in different sub-blocks of different blocks in different planes of a same die by varying the bit line voltages between the two blocks. The process of FIG. 17 can be used to operate the structure of FIG. 9 when control circuit 580 implements the structure of FIG. 10. In step 802 of FIG. 17, control circuit 580 applies the same word line voltage to different word lines of different sub-blocks in different blocks in different planes of the same die. For example, the same voltage is applied to word lines 584 and 586 of FIG. 9 from voltage generator 602. In step 804, control circuit 580 simultaneously programs memory cells that are connected to the different word lines of the different sub-blocks in different blocks in different planes and that are connected to different bit lines by applying different bit line signals to the different bit lines. Looking back at FIG. 9, step 804 is performed by control circuit 580 by applying a first set of bit line voltages via bit lines 590 and a second set of bit line voltages via bit lines 588. By varying the signal on the bit lines, the programming of one block can be sped up or slowed down so that the two blocks program at a similar speed and/or the two blocks program at appropriate speeds that balance performance and reliability.

FIG. 18 is another flowchart describing a process for programming. In one embodiment, the process of FIG. 18 represents an example implementation of the process of FIG. 17 for operating the components depicted in FIG. 9 when control circuit 580 implements the circuit of FIG. 10. In step 820 of FIG. 18, control circuit 580 applies a first bit line voltage signal to a first set of selected bit lines for a first block in a first plane of a first die. For example, control circuit 580 will apply a first set of bit line signals to bit lines 588. In step 822 of FIG. 18, control circuit 580 applies a second bit line voltage signal to a second set of selected bit lines for a second block in a second plane of the die. The first bit line voltage signal is different than the second bit line voltage signal. In one example, step 822 includes control circuit 580 applying the second bit line signal to bit lines (or a subset of bit lines) 590. In step 824, control circuit 580 applies the same word line voltage to a first word line in the first sub-block of the first block and a second word line in the second sub-block of the second block. For example, control circuit 580 apply the same voltage to the selected word line WL58 and selected word line WL69 via the circuit of FIG. 10. In step 826, control circuit 580 programs the first set of non-volatile memory cells connected to the first word line of the first block. The first set of non-volatile memory cells are also connected to the first set of bit lines. In step 828, simultaneously with programming the first set of non-volatile memory cells in step 826, control circuit 580 programs a second set of non-volatile memory cells connected to the second word line in the second block. The second set of non-volatile memory cells are connected to the second set of bit lines.

Figure 19:
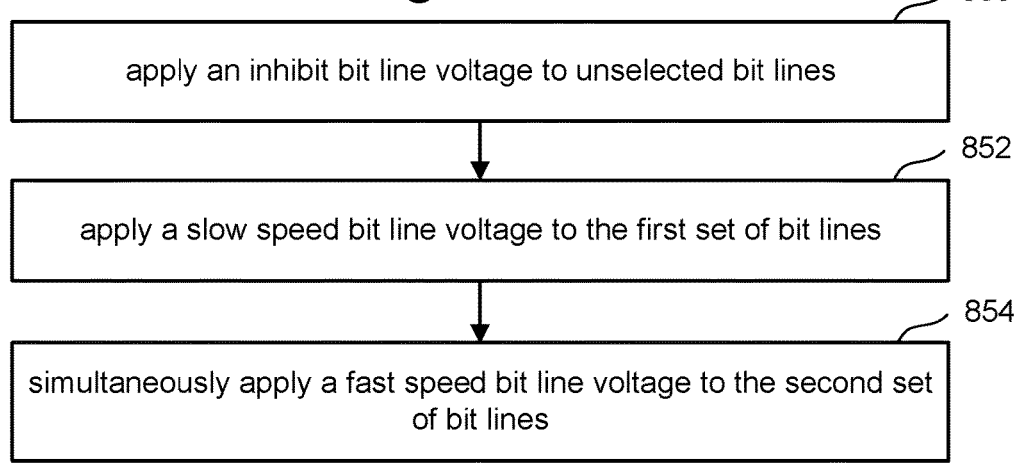
FIG. 19 is a flow chart describing one embodiment of a process for applying different bit line signals to the different bit lines.

FIG. 19 is a flowchart describing one embodiment of a process for applying different bit line signals to different bit lines in different blocks of different planes. For example, the process of FIG. 19 is an example implementation of step 804 of FIG. 17 or steps 820/822 of FIG. 18. In step 850, control circuit 580 applies an inhibit voltage to unselected bit lines of both blocks simultaneously being programmed. In one embodiment, the unselected bit line voltage is the same for both blocks. In another embodiment, the unselected bit line voltage can be different for the two blocks. In step 852, control circuit 580 applies a slow speed bit line voltage to the first set of bit lines. In step 854, control circuit 580 applies a fast speed bit line voltage to the second set of bit lines. The slow speed bit line voltage is higher than the fast speed bit line voltage. Step 854 is performed simultaneously with step 852. For example, in step 854, the slow speed bit line voltage can be applied to selected bit lines of bit lines 590 of FIG. 9 and the fast speed bit line voltage can be applied to selected bit line of bit lines 588 of FIG. 9. This way, the system will try to slow down the programming of the memory cells connected to WL69 of Block Y as compared to the speed of programming the memory cells connected to WL58 of Block X because the memory cells connected to word line WL69 have a smaller diameter than the memory cells connected to word line WL58.

Figure 20:
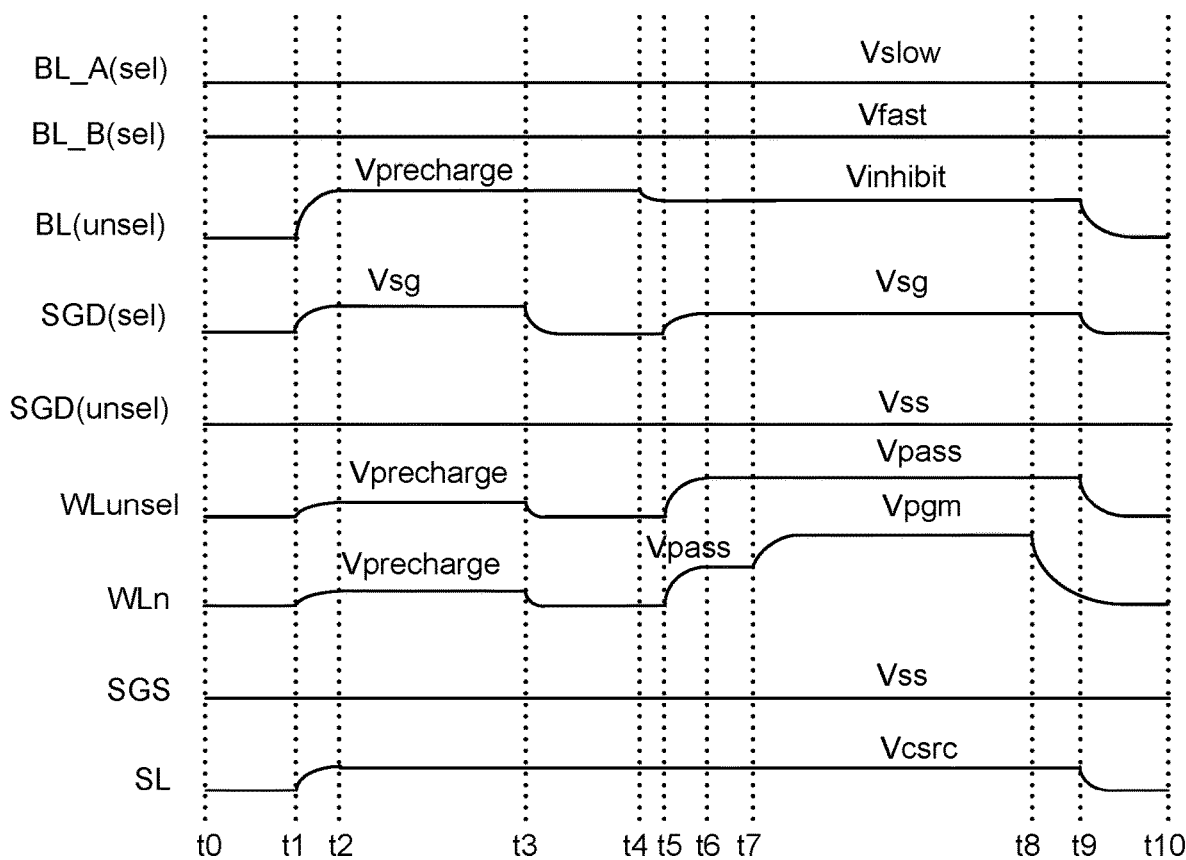
FIG. 20 is a signal diagram depicting one embodiment of a process for programming.

FIG. 20 is a signal diagram describing the behavior of various signals used to control the memory cells during programming. FIG. 20 describes an implementation of the embodiment of FIG. 19. FIG. 20 displays the following signals: BL_A(sel), BL_B(sel), BL(unsel), SGD(sel), SGD (unsel), WLunsel, WLn, SGS, and SL. The signal BL_A(sel) is the bit line signal applied to one of the blocks being programmed. For example, it can be the bit line signal for selected bit lines of bit lines 590 of FIG. 9. The signal BL_B(sel) is the selected bit line voltage signal for the second block being simultaneously programmed. For example, BL_B(sel) can be the voltage applied to selected bit lines of bit lines 588. The signal BL(unsel) is the voltage applied to unselected bit lines for both blocks. For example, BL(unsel) can be applied to unselected bit lines of bit lines 588 and bit lines 590. The signal SGD(sel) is the SGD selection line for the appropriate portion of the block that is selected for programming (see FIG. 4F). The signal SGD (unsel) is the SGD lines that are unselected for the portions of the block that are unselected (see FIG. 4F). The signal WLunsel are the unselected word lines, meaning the word lines that are not connected to memory cells selected for being programmed at this time. The signal WLn is the selected word lines in the two blocks being simultaneously programmed (using the embodiment of FIG. 10). The signal SGS represents all the SGS signals depicted in FIG. 4F. The signal SL is the source line signal described above.

In one embodiment, the fast speed bit line voltage of step 854 is a voltage that allows the memory cells to program as fast as they normally can. One example of the fast speed bit line voltage (Vfast) is 0 volts or something close thereto. In one example embodiment, the slow speed bit line voltage (Vslow) is a voltage that is close to Vfast (higher than Vfast but lower than Vinhibit) that allows the memory cells to continue to be programmed but slower than if they received Vfast. In one example embodiment, Vslow is 0.8 volts or something close to that. In another example, Vslow can be equal to 0.5 volts. BL_A(sel) receives the slow sped bit line voltage Vslow. BL_B(sel) receives the fast speed bit line voltage Vfast.

At time t1, BL(unsel) is raised from ground to a pre-charge voltage Vprecharge in order to allow for pre-charging as per step 542 of FIG. 7. At time t4, the unselected bit line voltage BL(unsel) is lowered to Vinhibit and then the voltage is lowered down to ground at time t9. At time t1, SGD (sel) is raised to Vsg which is a voltage high enough to turn on the transistor for the select gate (e.g., 3.5 v). This allows unselected NAND strings to be pre-charged and selected NAND strings to not be pre-charged. The voltage for SGD(sel) is lowered to ground at time t3, raised to Vsg at t5, and lowered to ground at t9. The SGD(unsel) signal is kept at ground or Vss the entire time period of FIG. 20. The unselected word lines WLunsel is raised to Vprecharge at time t1, lowered to ground at time t3, raised to Vpass (e.g., 7-10 v) at time t5, and lowered to ground at time t9. The signal WLunsel is set to Vprecharge in order to allow the pre-charging of step 542 of FIG. 7 and then raised to Vpass in order to allow the boosting of step 544 of FIG. 7. The signal WLn is raised to Vprecharge at time t1, lowered to ground to time t3, raised to Vpass at time t5, raised to Vpgm (the programming voltage) at time t7, and lowered down to ground at time t8. Note that the voltage on WLn between t7 and t8 represents the voltage pulse used for programming. SGS is kept at Vss or ground during the time period of FIG. 20. The source line is raised from ground to Vcsrc (e.g., 2.5-3.5 volts) at time t1 and then lowered to ground at time t9.

Using the slow speed bit line voltage as the bit line voltage in the embodiment of FIGS. 19 and 20 causes a small voltage in the channel of the selected NAND string which results in a smaller differential voltage between the channel and the word line, thereby, resulting in slower programming. That is, Vslow is a higher voltage than Vfast so that programming of memory cells receiving Vslow is slowed down as compared to applying Vfast.

Figure 23:
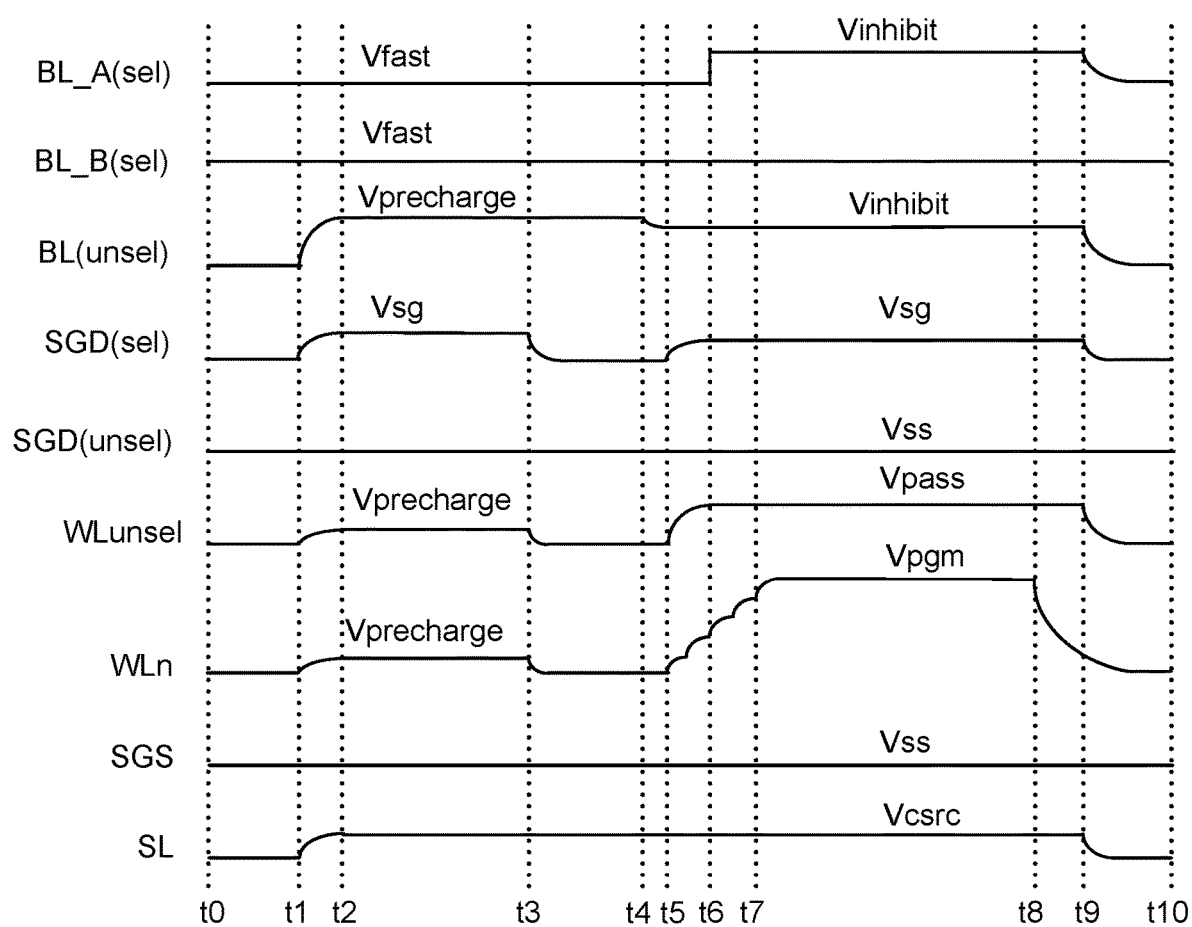
FIG. 23 is a signal diagram depicting one embodiment of a process for programming.

FIGS. 21-23 represent another set of embodiments that include slowing down programming for one of the blocks by allowing the selected NAND strings to be partially boosted during the boosting phase (see step 544 of FIG. 7). FIG. 21 is a flowchart describing one example embodiment of applying different bit line signals to the different selected bit lines of the different blocks being simultaneously programmed. Thus, the process of FIG. 21, is an example implementation of step 84 of FIG. 17 or an example implementation of steps 820/822 of FIG. 18. The process of FIG. 21 is performed by control circuit 580 applying voltages to bit lines 588 and 590.

In step 870 of FIG. 21, control circuit 580 boosts channels for unselected memory cells by applying boosting signals on unselected word lines WLunsel during a boosting phase of the programming process and applying a voltage signal to the selected word line that ramps up during a ramp up period which is part of the boosting phase. Step 872 includes control circuit 580 applying a voltage to a first bit line or first set of bit lines for a first block of the different blocks to prevent boosting for selected memory cells of the first block that are connected to the first bit line or first set of bit lines. In step 874, control circuit 580 will commence application of a second voltage to a second bit line or second set of bit lines for a second block of the different blocks in the middle of the ramp up period mentioned above in order to allow partial boosting for the selected memory cell of the second block connected to the second bit line or second set of bit lines. In this embodiment, one of the blocks is allowed to program at normal speed ant the other block is slowed down as a result of partial boosting. For the block that is slowed down, a bit line voltage is commenced during a boosting period. This is explained by FIG. 22.

FIG. 22 is a signal diagram depicting the same signals as FIG. 20. The difference between FIG. 22 and FIG. 20 is for the signals BL_A(sel) and BL_B(sel). The signal BL_B(sel) is applied to bit lines of the second block that are selected for programming. This is the fast programming used for slower memory cells. Thus, BL_B(sel) is set to Vfast during the entire time period of FIG. 22. The signal BL_A(sel) is initially set at Vfast. At time t7, BL_A(sel) is raised to Vinhibit until t9, at which time it is ramped back down to ground. In another embodiment, at time t7 BL_A(sel) is raised to Vslow until t9, at which time it is ramped back down to ground. As can be seen, BL_A(sel) commences application of the second voltage (Vslow) at time t7, which is in the middle of the ramp up period for WL_n. That is WL_n starts ramping up at t5 and completes ramping up after t7 when it reaches Vpgm. Thus BL_A(sel) is raised to Vslow during that ramp up period after WLn is raised from ground and prior to it reaching Vpgm. In the example of FIG. 22, BL_A(sel) is raised to Vslow after WLn is at Vpass. In other embodiments, the bit line can be raised at a different point during the ramp up period. FIG. 23 is an alternate embodiment where the selected word line WLn is raised in multiple steps between t5 and t7. In this case, BL_A(sel) can be raised at any point between t5 and t7 (e.g. at time t6). The choice for when to raise BL_A(sel) is based on how much the programming should be slowed down as discussed above (e.g., based on word line position). In another embodiment WLunsel is raised to Vpass in multiple steps.

The embodiments of FIGS. 21-23 include the control circuit being configured to apply the different bit line signals to the different bit lines by applying a voltage to a first bit line for a first block of the different blocks to prevent boosting for a selected memory cell of the first block connected to the first bit line and commencing application of a second voltage to a second bit line for a second block of the different blocks in the middle of the ramp up period to allow partial boosting for a selected memory cell of the second block connected to the second bit line.

FIGS. 24 and 25 represent another embodiment for applying different bit line signals to different bit lines of different blocks simultaneously being programmed in different planes of the same die. More specifically, FIG. 24 is a flowchart describing an embodiment for applying the different bit line signals. The process of FIG. 24 is an example implementation of step 804 of FIG. 17 or steps 820/822 of FIG. 18. In one embodiment, the process of FIG. 24 is performed by control circuit 580.

In step 900 of FIG. 24, control circuit 580 applies a voltage pulse to the different word lines. That is, as per the embodiment of FIG. 10, the same voltage pulse is applied to the selected word line in the first block (e.g. Block X) and the selected word line of the second block (e.g. Block Y). In step 902, control circuit 580 applies the first voltage signal to a first bit line for the first block of the different blocks. In step 904, simultaneously with performing step 902, control circuit 580 applies a second voltage signal to a second bit line for a second block of the different blocks. Thus, step 902 can include applying a first signal to the selected bit lines of bit lines 588 and step 904 can include control circuit 580 applying a second signal to the selected bit lines of bit lines 590 (or vice versa). In step 906, the second voltage signal is lowered during the voltage pulse (e.g. in the middle of pulse) from a first voltage level that inhibits programming to a second voltage level that allows programming.

As discussed above, when the bit line connected to a NAND string is raised up to an inhibit level, programming does not get performed for memory cells connected to that NAND string. When the bit line is at ground, programming can be performed. Step 906 of FIG. 24 includes initially starting the bit line voltage in an inhibit volt mode and lowering it down to ground or another voltage level that allows programming.

FIG. 25 is a timing diagram that explains the process of FIG. 24. FIG. 25 displays the same signals as FIGS. 22 and 23. Each of the signals in FIG. 25 operate in the same manner as FIG. 22 except for BL_A(sel). In this embodiment, BL_A(sel) is raised to Vprecharge at time t1 and then lowered to Vinhibit (e.g., ~2.5-5 v) at time t4 for the start of the program pulse (which starts at t7). The program pulse starts at time t7 and ends at time t8. At some point between t7 and t8, BL_A(sel) is lowered from the inhibit voltage Vinhibit to ground Vss (which, in some embodiments, is equal to Vfast). Prior to lowering BL_A(sel), the memory cells connected to those bit lines receiving that signal Vinhibit are not programmed. Once the bit line is lowered down to Vss or Vfast, those memory cells start to get programmed. This shortens the effective duration of the program pulse experienced by the memory cell. With a shorter programming pulse, the memory cell programs slower.

The above embodiments improve performance due to programming multiple planes in parallel with mixed sub-blocks. Additionally, sub-block mode increases the usable capacity of a memory die. It improves cost by increasing yield and/or requiring fewer extended blocks to be included in the design. Multi-plane programming maximizes the performance parallelism of multi plane dies allowing simultaneous programming of different sub-blocks during multi-plane programming and allows for the highest flexibility and sub-block usage. This is especially true when recovering good sub-blocks from blocks that would otherwise be marked bad. Different physical word lines require different program voltages (Vpgm) in order to optimally balance reliability with program performance. The above-described technology enables simultaneous use of all of the above concepts.

One embodiment includes a non-volatile storage apparatus, comprising a plurality of non-volatile memory cells arranged in multiple planes on a same die, each plane includes multiple blocks of the memory cells, each of the blocks includes multiple sub-blocks of memory cells; word lines connected to the memory cells; and a control circuit connected to the memory cells and the word lines, the control circuit configured to simultaneously program memory cells connected to different word lines that are in different sub-blocks of different blocks in different planes of a die.

One embodiment includes a method for programming non-volatile memory, comprising: programming a first set of non-volatile memory cells connected to a first word line in a lower sub-block of a block in a first plane on a die; and simultaneously with programming the first set of non-volatile memory cells, programming a second set of non-volatile memory cells connected to a second word line in an upper sub-block of a block in a second plane on the die.

One embodiment includes a non-volatile storage apparatus, comprising: a plurality of non-volatile memory cells arranged in multiple planes on a same die and a control circuit connected to the memory cells. Each plane includes multiple blocks of the memory cells. Each of the blocks includes multiple sub-blocks of memory cells. The control circuit is configured to simultaneously program memory cells connected to different word lines in different sub-blocks of different blocks using different starting voltages for the different word lines.

One embodiment includes a non-volatile storage apparatus, comprising a monolithic three dimensional memory array comprising multiple planes on a same die. Each plane comprises multiple blocks. Each of the blocks comprises a lower set of alternating conductive and dielectric layers and an upper set of alternating conductive and dielectric layers separated by a joint area that together form a plurality of word lines connected to a plurality of vertical NAND strings. Each NAND string includes multiple non-volatile memory cells. Each of the blocks includes multiple sub-blocks of memory cells. Each sub-block of a block has a non-intersecting set of word lines as compared to other sub-blocks of the block. The apparatus further comprises means for independently programming sub-blocks of a same block, including means for simultaneously programming memory cells connected to different word lines that are in different sub-blocks of different blocks in different planes using different starting programming voltages for the different word lines.

Examples of the means for independently programming sub-blocks of a same block, including means for simultaneously programming memory cells connected to different word lines that are in different sub-blocks of different blocks in different planes using different starting programming voltages include control circuit 580 of FIG. 9, controller 120 of FIG. 1, control circuitry 310 of FIG. 2 (which includes a state machine or microcontroller), or a different processor, including the voltage source configurations of FIGS. 11-13, and performing any of the processes of FIGS. 14-16.

One embodiment includes a non-volatile storage apparatus that comprises memory structure. The memory structure includes a first plane and a second plane on a same die. Each plane includes multiple blocks of non-volatile memory cells. Each of the blocks includes a first sub-block and a second sub-block that can be independently programmed. The memory structure includes word lines. The apparatus also includes a first voltage source, a second voltage source, a first switching network connected to the first voltage source and a first set of word lines for a first sub-block of a first block of the first plane, and a second switching network connected to the second voltage source and a second set of word lines for a second sub-block of a second block of the second plane.

One embodiment includes a non-volatile storage apparatus, comprising: a plurality of non-volatile memory cells arranged in multiple planes on a same die, each plane includes multiple blocks of the memory cells; word lines connected to the memory cells; bit lines connected to the memory cells; and a control circuit connected to the word lines and bit lines. The control circuit is configured to simultaneously program memory cells that are connected to different word lines of different blocks in different planes and connected to different bit lines by applying a same word line voltage to the different word lines and different bit line signals to the different bit lines.

In one example implementation, the plurality of non-volatile memory cells and the word lines comprise a lower set of alternating conductive and dielectric layers, a joint area above the lower set of alternating conductive and dielectric layers, an upper set of alternating conductive and dielectric layers above the joint area, and a plurality of memory columns located in the lower set of alternating conductive and dielectric layers and located in the upper set of alternating conductive and dielectric layers. The plurality of memory columns form vertical NAND strings, the plurality of memory columns increase in diameter along the vertical axis from bottom to top (e.g., see FIG. 8).

One embodiment includes a method for programming non-volatile memory, comprising: programming a first set of non-volatile memory cells connected to a first word line in a lower sub-block of a first block in a first plane on a die, the first set of non-volatile memory cells connected to a first set of bit lines; simultaneously with the programming of the first set of non-volatile memory cells, programming a second set of non-volatile memory cells connected to a second word line in an upper sub-block of a second block in a second plane on the die, the second set of non-volatile memory cells connected to a second set of bit lines; and while programming the first set of non-volatile memory cells and programming the second set of non-volatile memory cells, applying a first bit line voltage signal to selected bit lines of the first set of bit lines and a second bit line voltage signal to selected bit lines of the second set of bit lines, the first bit line voltage signal is different than the second bit line voltage signal.

One embodiment includes a non-volatile storage apparatus, comprising: word lines; bit lines, including a first set of bit lines and a second set of bit lines; a plurality of non-volatile memory cells connected to the word lines and the bit lines, the plurality of memory cells comprises a first set of non-volatile memory cells arranged on a first plane on a memory die and a second set of non-volatile memory cells arranged on a second plane on the memory die, the first plane comprises a plurality of blocks including a first block, the first block includes an upper sub-block and a lower sub-block that share bit lines but do not share word lines, the first block connected to the first set of bit lines, the second plane comprises a plurality of blocks including a second block, the second block includes an upper sub-block and a lower sub-block that share bit lines but do not share word lines, the second block connected to the second set of bit lines; and a control circuit connected to the word lines and the bit lines, the control circuit configured to simultaneously program memory cells connected to a first word line in the lower sub-block of the first block and memory cells connected to a second word lines in the upper sub-block of the second block by: applying a same word line voltage signal to the first word line and the second word line, and applying a first bit line voltage signal to selected bit lines of the first set of bit lines and a second bit line voltage signal to selected bit lines of the second set of bit lines, the first bit line voltage signal is different than the second bit line voltage signal.

One embodiment includes a non-volatile storage apparatus, comprising: a monolithic three dimensional memory array comprising multiple planes on a same die, each plane comprises multiple blocks, each of the blocks comprises a lower set of alternating conductive and dielectric layers and an upper set of alternating conductive and dielectric layers separated by a joint area that together form a plurality of word lines connected to a plurality of vertical NAND strings, each NAND string includes multiple non-volatile memory cells, each of the blocks includes multiple sub-blocks of memory cells, each sub-block of a block has a non-intersecting set of word lines as compared to other sub-blocks of the block; bit lines connected to the NAND strings; and means for independently programming sub-blocks of the same block, including means for simultaneously programming memory cells connected to different word lines that are in different sub-blocks of different blocks in different planes on the same die using a same programming voltage for the different word lines and different bit line voltage signals for selected bit lines connected to the different blocks.

Examples of the means for independently programming sub-blocks of the same block, including means for simultaneously programming memory cells connected to different word lines that are in different sub-blocks of different blocks in different planes on the same die using a same programming voltage for the different word lines and different bit line voltage signals include control circuit 580 of FIG. 9, controller 120 of FIG. 1, control circuitry 310 of FIG. 2 (which includes a state machine or microcontroller), or a different processor, including the voltage source configurations of FIGS. 10-13, and performing any of the processes of FIG. 14, 15, 17 or 18 in conjunction with performing any of the processes of FIG. 19, 21 or 24.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a plurality of non-volatile memory cells arranged in multiple planes on a same die, each plane includes multiple blocks of the memory cells, each of the blocks includes multiple sub-blocks of memory cells including an upper sub-block and a lower sub-block, each of the blocks include non-volatile memory cells arranged in memory columns that form vertical NAND strings, the memory columns increase in diameter along a vertical axis from bottom to top of the lower sub-blocks and increase in diameter along the vertical axis from bottom to top of the upper sub-blocks;
word lines connected to the memory cells; and
a control circuit connected to the memory cells and the word lines, the control circuit comprises a first voltage source and a second voltage source that is different than the first voltage source, the first voltage source generates a first word line voltage signal for programming, the second voltage source generates a second word line voltage signal for programming, the control circuit is configured to apply the first word line voltage signal to a first word line connected to a first non-volatile memory cell in a first memory column at a first diameter of the first memory column in an upper sub-block of a first block in a first plane and simultaneously apply the second word line voltage signal to a second word line connected to a second non-volatile memory cell in a second memory column at a second diameter of the second memory column in a lower sub-block of a second block in a second plane to simultaneously program the first non-volatile memory cell and the second non-volatile memory cell, the first diameter is different than the second diameter, the control circuit is configured to make the second word line voltage signal different in magnitude at a same moment in time as the first word line voltage signal to account for the first diameter being different than the second diameter, the first plane and the second plane are on the same die.

2. The non-volatile storage apparatus of claim 1, wherein: the first word line voltage signal has a different starting voltage than the second word line voltage signal.

3. The non-volatile storage apparatus of claim 1, wherein: the control circuit is configured to independently program and erase sub-blocks of a same block.

4. The non-volatile storage apparatus of claim 1, wherein:
   each sub-block of a block has a non-intersecting set of word lines as compared to other sub-blocks of the block.

5. The non-volatile storage apparatus of claim 1, wherein: the first word line and the second word line are at different word line positions.

6. The non-volatile storage apparatus of claim 1, wherein the control circuit further comprises:
   a first switching network connected to the first voltage source and a first set of the word lines that includes the first word line; and
   a second switching network connected to the second voltage source and a second set of the word lines that includes the second word line.

7. A non-volatile storage apparatus according to claim 1, wherein:
   the first voltage source is a first charge pump; and
   the second voltage source is a second charge pump.

8. A non-volatile storage apparatus according to claim 1, wherein:
   the first voltage source is a charge pump; and
   the second voltage source is a voltage regulator connected to the charge pump.

9. A non-volatile storage apparatus according to claim 1, wherein:
   the first voltage source is a first voltage regulator connected to a charge pump; and
   the second voltage source is a second voltage regulator connected to a charge pump.

10. The non-volatile storage apparatus of claim 1, wherein:
    the control circuit is configured to program memory cells in an order starting at middle word lines and working towards outer word lines.

11. The non-volatile storage apparatus of claim 1, wherein:
    the plurality of non-volatile memory cells and the word lines comprise a lower set of alternating conductive and dielectric layers, a joint area above the lower set of alternating conductive and dielectric layers, an upper set of alternating conductive and dielectric layers above the joint area, the upper sub-block includes the upper set of alternating conductive and dielectric layers above the joint area, the lower sub-block includes the lower set of alternating conductive and dielectric layers; and
    the memory columns include charge-trapping material that extends in the upper set of alternating conductive and dielectric layers and the lower set of alternating conductive and dielectric layers.

12. A non-volatile storage apparatus according to claim 1, wherein:
    the first non-volatile memory cell programs at a different rate in response to a common voltage than the second non-volatile memory cell because the first diameter is different than the second diameter, the control circuit is configured to make the second word line voltage signal different in magnitude at a same moment in time as the first word line voltage signal to cause the first non-volatile memory cell to simultaneously program at a similar speed as the second non-volatile memory cell.

13. A non-volatile storage apparatus according to claim 1, wherein:
    the control circuit is configured to make the second word line voltage signal different in magnitude at a same moment in time as the first word line voltage signal in order to apply at the same moment in time a higher voltage to a non-volatile memory cell of the first non-volatile memory cell and the second non-volatile memory cell that is at a larger diameter of its respective memory column and apply a lower voltage to a non-volatile memory cell of the first non-volatile memory cell and the second non-volatile memory cell that is at a smaller diameter of its respective memory column.

14. A method for programming non-volatile memory, comprising:
    programming a first set of non-volatile memory cells connected to a first word line in a lower sub-block of a block in a first plane on a die by applying a first programming voltage to the first word line from a first voltage source, the first set of non-volatile memory cells are in a first set of memory columns at a first diameter of the first set of memory columns; and
    simultaneously with programming the first set of non-volatile memory cells, programming a second set of non-volatile memory cells that are in a second set of memory columns at a second diameter of the second set of memory columns and are connected to a second word line in an upper sub-block of a block in a second plane on the die by simultaneously applying a second programming voltage to the second word line from a second voltage source in order to apply at the same moment in time a higher voltage to the set of non-volatile memory cells of the first set of non-volatile memory cells and the second set of non-volatile memory cells that is at a larger diameter of its respective memory columns and apply a lower voltage to the set of non-volatile memory cells of the first set of non-volatile memory cells and the second set of non-volatile memory cells that is at a smaller diameter of its respective memory columns.

15. The method of claim 14, wherein:
    the programming of the first set of non-volatile memory cells includes applying a first set of one or more voltage pulses to the first word line, the first set of one or more voltage pulses includes a first magnitude for a first voltage pulse of the first set of one or more voltage pulses; and
    the programming of the second set of non-volatile memory cells includes applying a second set of one or more voltage pulses to the second word line, the second set of one or more voltage pulses includes a second magnitude for a first voltage pulse of the second set of one or more voltage pulses, the second magnitude is different than the first magnitude.

16. The method of claim 15, wherein:
    the programming of the first set of non-volatile memory cells includes applying the first magnitude for the first voltage pulse of the first set of one or more voltage pulses from the first voltage source via a first switching circuit; and
    the programming of the second set of non-volatile memory cells includes applying the second magnitude for the first voltage pulse of the second set of one or more voltage pulses from the second voltage source via a second switching circuit.

17. A non-volatile storage apparatus, comprising:
    a three dimensional memory array comprising multiple planes on a same die, each plane comprises multiple blocks, each of the blocks comprises a lower set of alternating conductive and dielectric layers and an upper set of alternating conductive and dielectric layers separated by a joint area that together form a plurality of word lines connected to a plurality of vertical NAND strings formed by memory columns, each NAND string includes multiple non-volatile memory cells, each of the blocks includes multiple sub-blocks of memory cells, each sub-block of a block has a non-intersecting set of word lines as compared to other sub-blocks of the block, each block includes an upper sub-block and a lower sub-block, the upper sub-block includes the upper set of alternating conductive and dielectric layers, the lower sub-block includes the lower set of alternating conductive and dielectric layers, the memory columns vary in diameter along a vertical axis; and means for simultaneously programming memory cells connected to different word lines that are in different sub-blocks of different blocks in different planes of a same die using different starting programming voltages for the different word lines to cause a first non-volatile memory cell connected a first memory column at a first diameter of the first memory column to simultaneously program at a similar speed as a second non-volatile memory cell connected a second memory column at a second diameter of the first memory column, the first non-volatile memory cell programs at a different rate in response to a common voltage than the second non-volatile memory cell because the first diameter is different than the second diameter.

* * * * *